United States Patent
Kurokawa

(10) Patent No.: US 9,379,113 B2
(45) Date of Patent: Jun. 28, 2016

(54) PROGRAMMABLE LOGIC DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 150 days.

(21) Appl. No.: 13/754,979

(22) Filed: Jan. 31, 2013

(65) Prior Publication Data

US 2013/0207170 A1 Aug. 15, 2013

(30) Foreign Application Priority Data

Feb. 9, 2012 (JP) ................................. 2012-026105

(51) Int. Cl.
*H01L 29/10* (2006.01)
*H01L 27/105* (2006.01)
(Continued)

(52) U.S. Cl.
CPC .............. *H01L 27/105* (2013.01); *H01L 21/82* (2013.01); *H01L 27/0207* (2013.01); *H01L 27/11807* (2013.01); *H01L 27/11898* (2013.01); *H01L 27/1225* (2013.01); *H03K 19/1776* (2013.01);
(Continued)

(58) Field of Classification Search
USPC ........................................ 326/37–41, 47, 101
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1 737 044 A1   12/2006
EP   2 226 847 A2   9/2010
(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184
(Continued)

*Primary Examiner* — Cuong Q Nguyen
*Assistant Examiner* — Nishath Yasmeen
(74) *Attorney, Agent, or Firm* — Fish & Richardson P.C.

(57) ABSTRACT

To provide a programmable logic device in which the number of elements per bit in a memory array can be reduced and with which power consumption or operation frequency can be estimated accurately at a testing stage. Provided is a programmable logic device including a plurality of programmable logic elements and a memory array which stores configuration data that determines logic operation executed in the plurality of programmable logic elements. The memory array includes a plurality of memory elements. The memory element includes a node which establishes electrical connection between the programmable logic element and the memory array, a switch for supplying charge whose amount is determined by the configuration data to the node, holding the charge in the node, or releasing the charge from the node, and a plurality of wirings. Capacitance is formed between the node and the wiring.

9 Claims, 20 Drawing Sheets

(51) Int. Cl.
*H01L 21/82* (2006.01)
*H01L 27/02* (2006.01)
*H01L 27/118* (2006.01)
*H03K 19/177* (2006.01)
*H01L 27/12* (2006.01)

(52) U.S. Cl.
CPC .... *H03K 19/17728* (2013.01); *H03K 19/17748* (2013.01)

(56) References Cited

U.S. PATENT DOCUMENTS

| | | | |
|---|---|---|---|
| 6,127,702 | A | 10/2000 | Yamazaki et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0148171 | A1 | 6/2010 | Hayashi et al. |
| 2011/0089417 | A1* | 4/2011 | Yamazaki .......... H01L 27/0688 257/43 |
| 2011/0102018 | A1* | 5/2011 | Shionoiri ............ H01L 27/1225 326/98 |
| 2011/0175646 | A1 | 7/2011 | Takemura et al. |
| 2011/0233617 | A1* | 9/2011 | Or-Bach et al. ............... 257/202 |
| 2012/0212995 | A1 | 8/2012 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

(56) References Cited

OTHER PUBLICATIONS

Clark, S et al., "First Principles Methods Using CASTEP," Zeitschrift fur Kristallographie, 2005, vol. 220, pp. 567-570.
Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTS) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG—Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancles in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "Suftla Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crys-

(56) References Cited

OTHER PUBLICATIONS talline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivaton Layer," SID Digest '09 : SID International Symposium Digest of Technical Papers, May 31, 2009, pp. 284-287.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931.

T. Naito et al.; "World's first monolithic 3D-FPGA with TFT SRAM over 90nm 9 layer Cu CMOS"; 2010 Symposium on VLSI Technology : Digest of Technical Papers; Jun. 15, 2010; pp. 219-220.

Y. Yanagawa et al.; "In-substrate-bitline Sense Amplifier with Array-noise-gating Scheme for Low-noise 4F2 DRAM Array Operable at 10-fF Cell Capacitance"; 2011 Symposium on VLSI Circuits Digest of Technical Papers; Jun. 15, 2011; pp. 230-231; IEEE.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

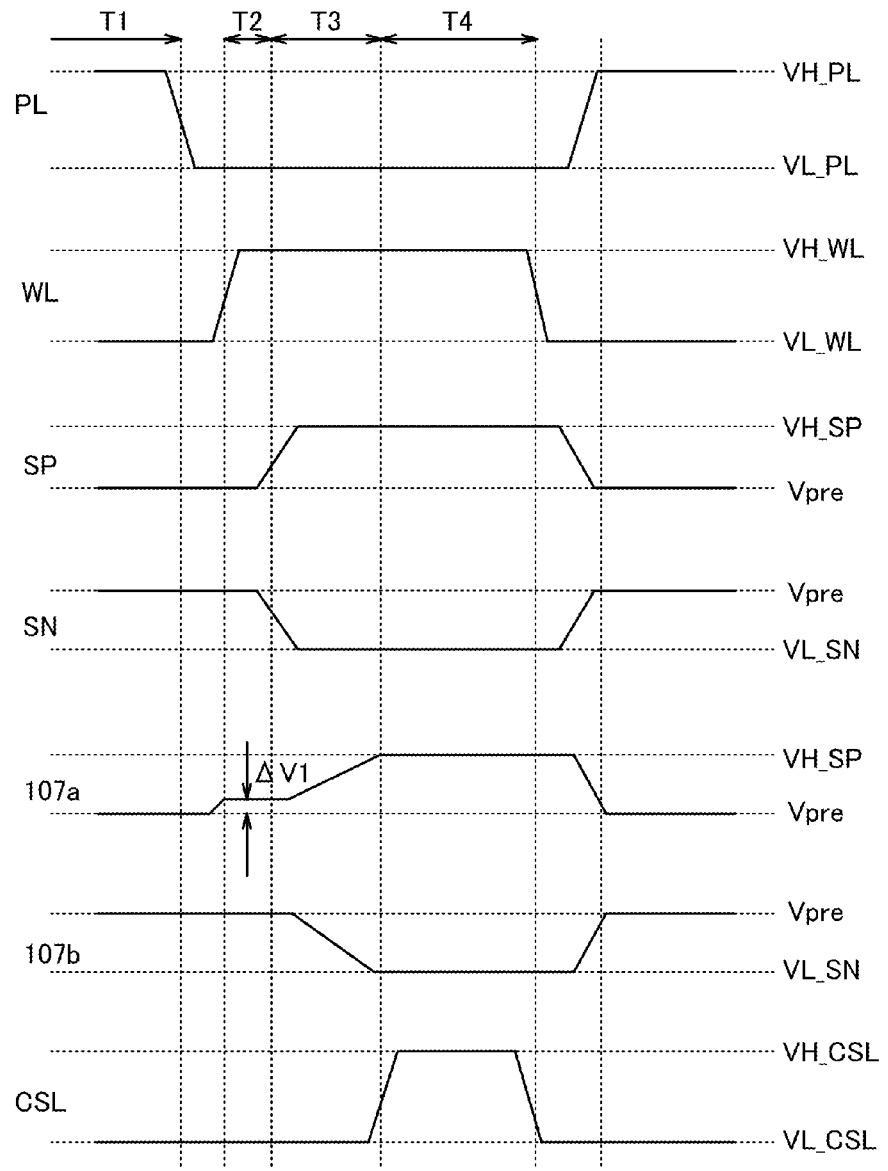

PROGRAMMABLE LOGIC DEVICE AND METHOD FOR MANUFACTURING SEMICONDUCTOR DEVICE

BACKGROUND OF THE INVENTION

1. Field of the Invention

The present invention relates to a programmable logic device with which the configuration of hardware can be changed and a method for manufacturing a semiconductor device using the programmable logic device.

2. Description of the Related Art

In a semiconductor device called a programmable logic device (PLD), a logic circuit is composed of an adequate number of programmable logic elements (basic blocks), and the function of each programmable logic element and interconnections between the programmable logic elements can be changed after manufacture. PLDs show flexibility in a reduction in development period and a change in design specification as compared with conventional application specific integrated circuits (ASICs) and gate arrays, which is advantageous, thus being widely used in recent years.

The PLD needs a memory device for storing data (configuration data) on the function of each programmable logic element and the connections between the programmable logic elements. This makes it difficult to avoid an increase in circuit size and cost per chip of the PLD; thus, PLDs are often employed for production of a prototype or small-quantity production. Meanwhile, a method for reducing the cost per chip is proposed in which a photomask corresponding to a circuit configuration that is tested with a PLD is formed and an ASIC is manufactured therewith. This method makes it possible to provide a semiconductor device with desired specifications at relatively low cost by changing only masks for the upper few layers as in gate arrays.

Non-Patent Document 1 below proposes a configuration in which an SRAM for storing configuration data is formed using polysilicon TFTs over a CMOS logic circuit functioning as a programmable logic element and, after configuration data is determined, an ASIC is manufactured with a new photomask corresponding to the data. The ASIC does not include the SRAM and has only the CMOS logic circuit on the chip; thus, an increase in circuit size can be suppressed.

REFERENCE

Non-Patent Document

[Non-Patent Document 1] T. Naito et al., "World's first monolithic 3D-FPGA with TFT SRAM over 90 nm 9 layer Cu CMOS", 2010 Symposium on VLSI Technology Digest of Technical Papers, 2010, pp. 219-220.

SUMMARY OF THE INVENTION

However, in the configuration of Non-Patent Document 1, the SRAM having a large number of elements per bit is formed over the CMOS logic circuit; thus, defects are likely to be caused, which makes it difficult to manufacture a PLD with high yield.

Moreover, an SRAM composed of polysilicon TFTs not only consumes power in an operating state, but also consumes more than a little power in a non-operating state owing to the off-state current of the polysilicon TFTs, and power consumed by the PLD includes the power consumed by the SRAM. Therefore, power consumption of a semiconductor device that is manufactured based on the PLD cannot be estimated accurately at the stage of testing the PLD.

Further, the SRAM composed of polysilicon TFTs is replaced with wirings in manufacture of a semiconductor device based on the PLD; thus, the layout of a layer over the CMOS logic circuit is greatly changed. Therefore, operation delay and power consumption due to parasitic capacitance between various wirings also cannot be estimated accurately at the stage of testing the PLD.

In view of the foregoing technical background, an object of one embodiment of the present invention is to provide a programmable logic device in which the number of elements per bit in a memory array can be reduced. Another object of one embodiment of the present invention is to provide a programmable logic device with which power consumption or operation frequency can be estimated accurately at a testing stage.

Another object of one embodiment of the present invention is to provide a method for manufacturing a semiconductor device which enables power consumption or operation frequency to be estimated accurately at the stage of testing with a programmable logic device.

In one embodiment of the present invention, in a programmable logic device, a memory array which stores configuration data is provided over a plurality of programmable logic elements which compose a logic circuit in accordance with the configuration data. The programmable logic elements are electrically connected to the memory array. A plurality of memory elements included in the memory array each include a node which establishes electrical connection between the programmable logic element and the memory array, a switch for supplying charge whose amount is determined by the configuration data to the node, holding the charge in the node, or releasing the charge from the node, and a plurality of wirings. Capacitance is formed between the node and the wiring.

In one embodiment of the present invention, only one transistor, which composes a switch, needs to be provided in each memory element. Therefore, the number of elements per bit can be reduced as compared with the case where an SRAM is used as a memory array.

In the above programmable logic device, the logic circuit that is composed of the plurality of programmable logic elements varies depending on the configuration data. In one embodiment of the present invention, after determination of the configuration data, a plurality of wirings are formed over a plurality of programmable logic elements, which are additionally prepared, to be connected to the plurality of programmable logic elements in accordance with the configuration data, whereby a semiconductor device is manufactured.

In one embodiment of the present invention, a semiconductor device is manufactured by replacement of a memory array provided in the upper layer of a programmable logic device with a plurality of wirings. In one embodiment of the present invention, the memory array of the programmable logic device already includes the plurality of wirings; accordingly, the difference in parasitic capacitance generated between the programmable logic elements in the lower layer and the wirings in the upper layer can be reduced between the programmable logic device and the semiconductor device. Therefore, power consumption or operation frequency of the semiconductor device due to the parasitic capacitance can be estimated accurately by testing of the programmable logic device.

As another feature of the present invention, a switch provided in a memory element may be composed of a transistor with small off-state current in one embodiment of the present invention. For example, a transistor including, in a channel formation region, a semiconductor which has a wide band gap and is highly purified by reduction of impurities serving as electron donors (donors), such as moisture or hydrogen, and by reduction of oxygen vacancies has extremely small off-state current. In one embodiment of the present invention, the above transistor is used as a switch, whereby leakage of charge held in a node can be prevented. Accordingly, power consumption of the memory array due to the off-state current of a transistor can be reduced as compared with the case where an SRAM composed of polysilicon TFTs is used. Therefore, power consumption of the semiconductor device manufactured based on the programmable logic device can be estimated accurately at the stage of testing the programmable logic device.

Specifically, a programmable logic device according to one embodiment of the present invention includes a plurality of programmable logic elements and a memory array which stores configuration data that determines logic operation executed in the plurality of programmable logic elements. The memory array includes a plurality of memory elements. The memory element includes a node which establishes electrical connection between the programmable logic element and the memory array, a switch for supplying charge whose amount is determined by the configuration data to the node, holding the charge in the node, or releasing the charge from the node, and a plurality of wirings. Capacitance is formed between the node and the wiring.

Specifically, a programmable logic device according to one embodiment of the present invention includes a plurality of programmable logic elements, a wiring array, and a memory array which stores configuration data that determines logic operation executed in the plurality of programmable logic elements or connections between the plurality of programmable logic elements established by the wiring array. The memory array includes a plurality of memory elements. The memory element includes a node which establishes electrical connection between the programmable logic element and the memory array, a switch for supplying charge whose amount is determined by the configuration data to the node, holding the charge in the node, or releasing the charge from the node, and a plurality of wirings. Capacitance is formed between the node and the wiring.

Specifically, in a method for manufacturing a semiconductor device according to one embodiment of the present invention, over a plurality of first programmable logic elements, a memory array which stores configuration data that determines logic operation executed in the plurality of first programmable logic elements is formed, so that a programmable logic device is formed; and over a plurality of second programmable logic elements, a plurality of wirings connected to the plurality of second programmable logic elements in accordance with the configuration data are formed after determination of the configuration data in the programmable logic device. The memory array includes a plurality of memory elements. The memory element includes a node which establishes electrical connection between the first programmable logic element and the memory array, a switch for supplying charge whose amount is determined by the configuration data to the node, holding the charge in the node, or releasing the charge from the node, and a plurality of wirings. Capacitance is formed between the node and the wiring.

According to one embodiment of the present invention, a programmable logic device in which the number of elements per bit in a memory array can be reduced can be provided. According to one embodiment of the present invention, a programmable logic device with which power consumption or operation frequency can be estimated accurately at a testing stage can be provided. According to one embodiment of the present invention, a method for manufacturing a semiconductor device which enables power consumption or operation frequency to be estimated accurately at the stage of testing with a programmable logic device can be provided.

BRIEF DESCRIPTION OF THE DRAWINGS

FIG. 10 is a timing chart.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments.

Note that a semiconductor device of the present invention includes, in its category, various semiconductor integrated circuits formed using semiconductor elements, such as microprocessors, image processing circuits, controllers for semiconductor display devices, digital signal processors (DSPs), micro controllers, and the like. In addition, the semiconductor device of the present invention also includes, in its category, various devices formed using the above semiconductor integrated circuits, such as RF tags, semiconductor display devices, and the like. The semiconductor display devices include, in its category, liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in which a semiconductor element is included in a driver circuit.

Embodiment 1

Figure 1A:
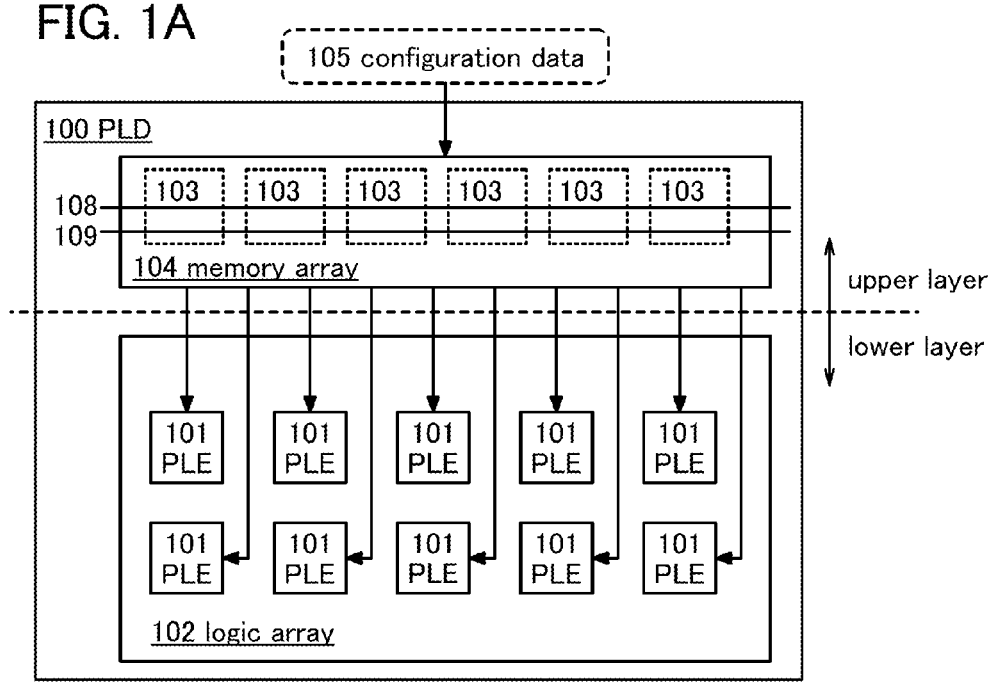
FIGS. 1A and 1B illustrate a configuration of a programmable logic device.

FIG. 1A schematically illustrates a configuration example of a PLD according to one embodiment of the present invention. A PLD 100 illustrated in FIG. 1A includes a logic array 102 including a plurality of programmable logic elements (PLEs) 101 and a memory array 104 including a plurality of memory elements 103. The memory array 104 is provided over a layer in which the logic array 102 is formed.

Each PLE 101 is a logic element whose logic operation, i.e., an output value corresponding to an input value, is determined by configuration data 105. Determination of the logic operation executed by each PLE 101 by the configuration data 105 results in determination of the function of a logic circuit that is configured in the logic array 102.

The memory array 104 has a function of storing the configuration data 105. The memory array 104 is provided with a plurality of wirings for supplying power supply potential to each memory element 103. FIG. 1A illustrates, as an example, the case where the memory array 104 is provided with a wiring 108 and a wiring 109.

Figure 1B:
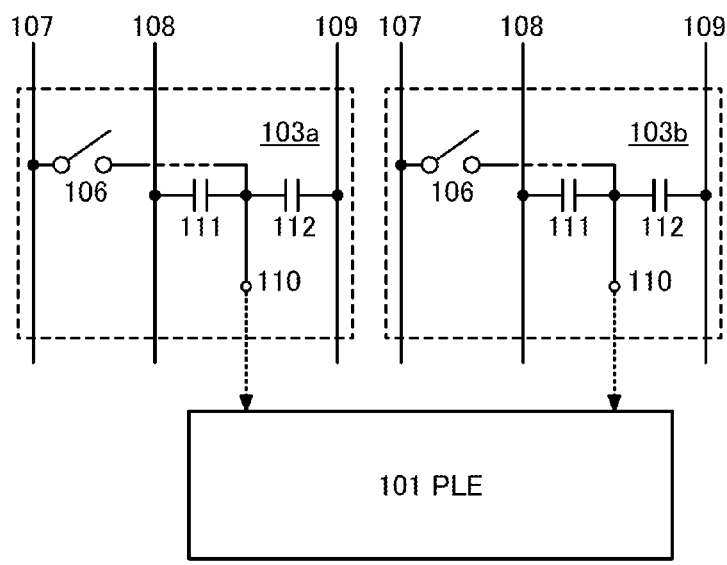

FIG. 1B schematically illustrates a specific configuration example of the memory element 103 and an example of connections between the memory elements 103 and the PLEs 101. Note that FIG. 1B illustrates, as an example, the case where a memory element 103a and a memory element 103b, which correspond to two of the plurality of memory elements 103, are assigned to one of the PLEs 101.

As exemplified by the memory elements 103a and 103b in FIG. 1B, the memory element 103 includes a switch 106 and wirings 107 to 109. The wiring 107 has a function of transmitting the configuration data 105 to each memory element 103. The wirings 108 and 109 each have a function of supplying power supply potential to each memory element 103. In FIG. 1B, each memory element 103 includes the wiring 108 for supplying a high-level power supply potential to the memory element 103 and the wiring 109 for supplying a low-level power supply potential to the memory element 103; however, the number of wirings for supplying power supply potential to each memory element 103 may be three or more.

Electrical connection between the PLE 101 and the memory element 103 is established by a node 110. In the memory element 103, capacitance is formed between the node 110 and each of the wirings 108 and 109. In FIG. 1B, the capacitance formed between the node 110 and the wiring 108 is shown as a capacitor 111, and the capacitance formed between the node 110 and the wiring 109 is shown as a capacitor 112.

Note that the term "connection" in this specification refers to electrical connection and corresponds to the state in which current, voltage, or a potential can be supplied or transmitted. Accordingly, a connection state means not only a state of direct connection but also a state of indirect connection through an element such as a wiring, a resistor, a diode, or a transistor so that current, voltage, or a potential can be supplied or transmitted.

The configuration data 105 that is transmitted through the wiring 107 is written into the node 110 via the switch 106. Specifically, charge whose amount is determined by the configuration data 105 is supplied through the wiring 107 to the node 110, the capacitor 111, and the capacitor 112 via the switch 106 that is turned on (put in a conduction state), whereby the configuration data 105 is written into the node 110. Next, the switch 106 is turned off (put in a non-conduction state), and the charge is held in the node 110, the capacitor 111, and the capacitor 112, whereby the configuration data 105 is held in the memory element 103. Then, the switch 106 is turned on again, whereby the charge held in the node 110, the capacitor 111, and the capacitor 112 can be released to the wiring 107.

The configuration data 105 is transmitted from the memory element 103 to the PLE 101 through the node 110. In FIG. 1B, the configuration data 105 is transmitted from the memory elements 103a and 103b to one PLE 101; however, the configuration data 105 may be transmitted from one memory element 103 or three or more memory elements 103 to one PLE 101.

Figure 2A:
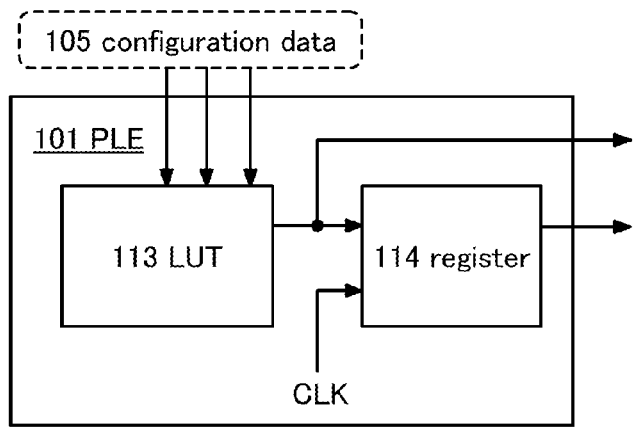
FIGS. 2A and 2B each illustrate a configuration of a programmable logic element.

FIG. 2A illustrates one mode of the PLE 101. The PLE 101 illustrated in FIG. 2A includes a look-up table (LUT) 113 and a register 114. Logic operation executed by the LUT 113 varies depending on the configuration data 105. Determination of the configuration data 105 results in determination of one output value corresponding to plural input values of the LUT 113. An output signal including the output value is output from the LUT 113. The register 114 holds the output signal from the LUT 113 and outputs a signal corresponding the output signal in synchronization with a clock signal CLK.

Note that the PLE 101 may include a multiplexer circuit with which selection can be made whether the output signal from the LUT 113 goes through the register 114 or not.

Further, the type of the register 114 may be determined by the configuration data 105. Specifically, the register 114 may have a function of any of a D register, a T register, a JK register, and an RS register depending on the configuration data 105.

Figure 2B:
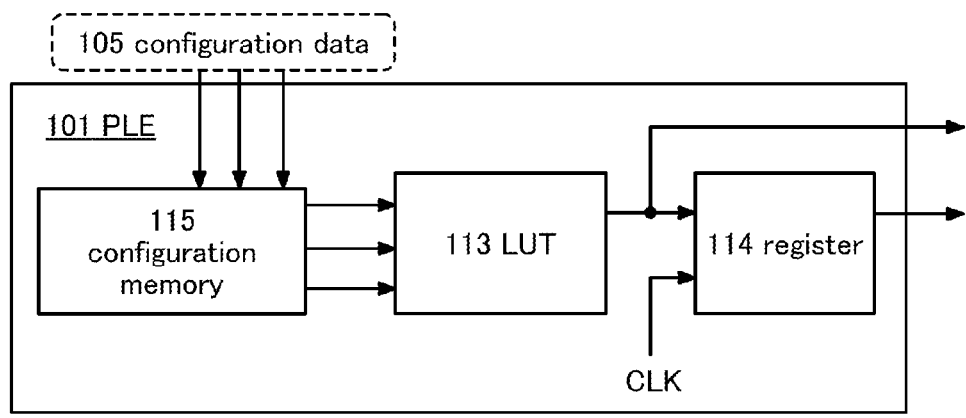

The PLE 101 may also include a memory device (configuration memory) for storing the configuration data 105 transmitted from the memory element 103. The PLE 101 in FIG. 2B has a structure in which a configuration memory 115 is added to the PLE 101 in FIG. 2A. With the configuration memory 115, the operation of determining again the logic operation executed in the PLE 101 in accordance with the same configuration data 105 can be performed at high speed as compared with the case where the configuration data 105 that is transmitted directly from the memory element 103 is used.

In one embodiment of the present invention, after determination of the configuration data 105, a plurality of wirings are formed over another logic array 102 to be connected to the plurality of PLEs 101 in accordance with the configuration data 105, whereby a semiconductor device is manufactured.

Figure 3A:
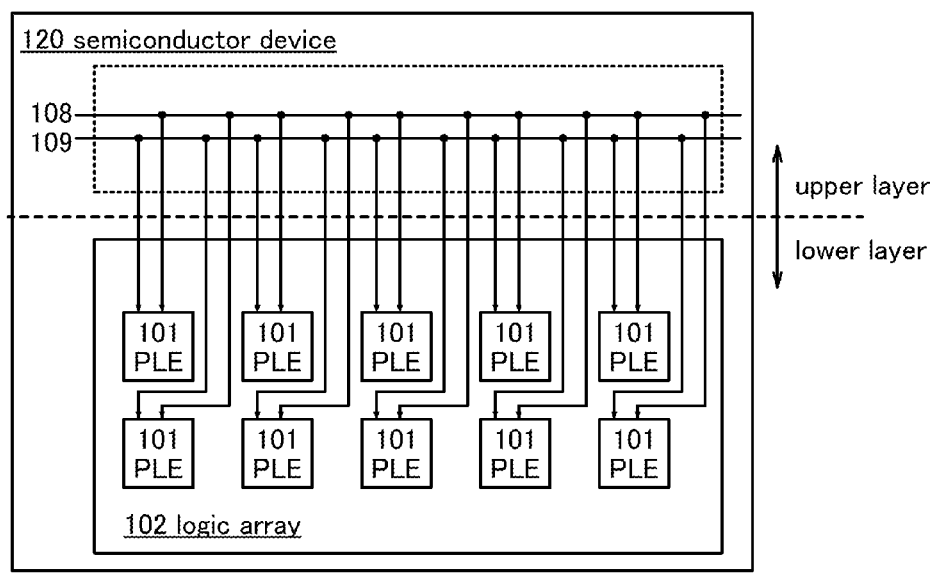
FIGS. 3A and 3B illustrate a configuration of a semiconductor device.

FIG. 3A schematically illustrates a configuration example of a semiconductor device 120 according to one embodiment of the present invention. The semiconductor device 120 in FIG. 3A is similar to the PLD 100 in FIG. 1A in including the logic array 102 that includes the plurality of PLEs 101. However, the semiconductor device 120 differs from the PLD 100 in FIG. 1A in that, instead of the memory array 104, a plurality of wirings corresponding to the plurality of wirings used for supply of power supply potential in the memory array 104 are provided over the layer in which the logic array 102 is formed.

FIG. 3A illustrates, as an example, the case where the wirings 108 and 109 are provided over the logic array 102 as the plurality of wirings corresponding to the plurality of wirings used for supply of power supply potential.

Figure 3B:
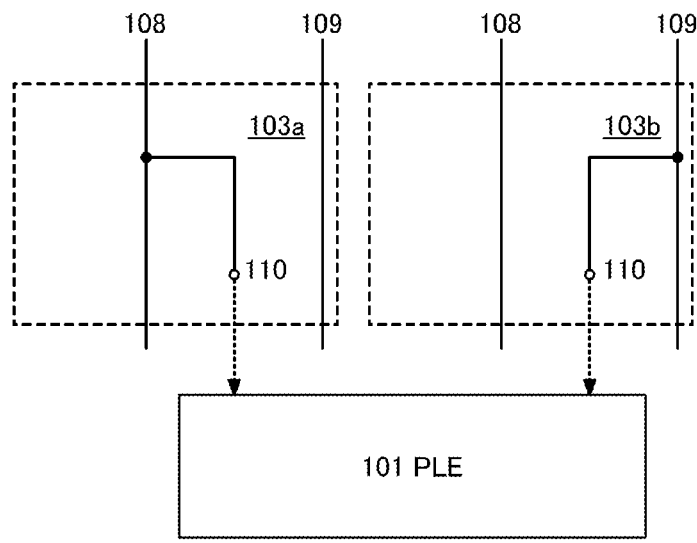

FIG. 3B schematically illustrates an example of connections between the PLEs 101 and the wirings 108 and 109. Note that FIG. 3B illustrates the case where the memory elements 103a and 103b in FIG. 1B are each replaced with the wirings 108 and 109.

In the semiconductor device according to one embodiment of the present invention, one of the wirings 108 and 109 which is selected in accordance with the configuration data 105 is connected to the PLE 101 through the node 110. Specifically, in the case exemplified in FIG. 3B, the wiring 108 is selected from the wirings 108 and 109, which are provided instead of the memory element 103a, to be connected to the PLE 101 through the node 110. Further, the wiring 109 is selected from the wirings 108 and 109, which are provided instead of the memory element 103b, to be connected to the PLE 101 through the node 110.

The logic operation of the PLE 101 is determined by the power supply potentials supplied from the wirings 108 and 109. Determination of the logic operation executed by each PLE 101 results in determination of the function of a logic circuit that is configured in the logic array 102.

In one embodiment of the present invention, the semiconductor device 120 is manufactured by replacement of the memory array 104 provided in the upper layer of the PLD 100 with a plurality of wirings, e.g., the wirings 108 and 109. In one embodiment of the present invention, the memory array 104 of the PLD 100 already includes the plurality of wirings. Accordingly, the difference in parasitic capacitance generated between the logic array 102 in the lower layer and the plurality of wirings in the upper layer can be reduced between the PLD 100 and the semiconductor device 120. Therefore, power consumption or operation frequency of the semiconductor device 120 due to the parasitic capacitance can be estimated accurately by testing of the PLD 100.

Note that not only the logic operation executed by the PLE 101 but also the connections between the PLEs 101 are determined by the configuration data 105. Specifically, the connections between the PLEs 101 are established by a wiring array provided in the logic array 102. The wiring array includes a wiring group including a plurality of wirings and switches for controlling connections between the wirings belonging to the wiring group.

Figure 4A:
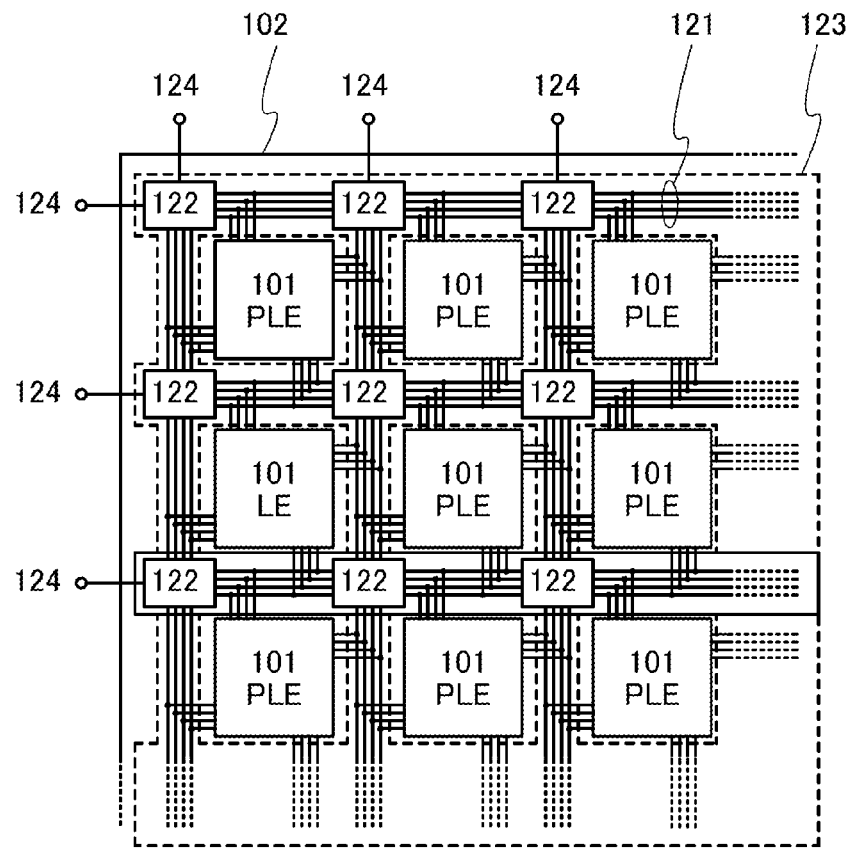
FIGS. 4A and 4B illustrate a configuration of a logic array and a configuration a switch.

FIG. 4A schematically illustrates, as an example, part of the configuration of the logic array 102. The logic array 102 illustrated in FIG. 4A includes the plurality of PLEs 101, a wiring group 121 connected to any of the plurality of PLEs 101, and switches 122 for controlling connections between the wirings belonging to the wiring group 121. The wiring group 121 and the switches 122 correspond to a wiring array 123. The connections between the wirings controlled by the switches 122 are determined by the configuration data 105.

Figure 4B:
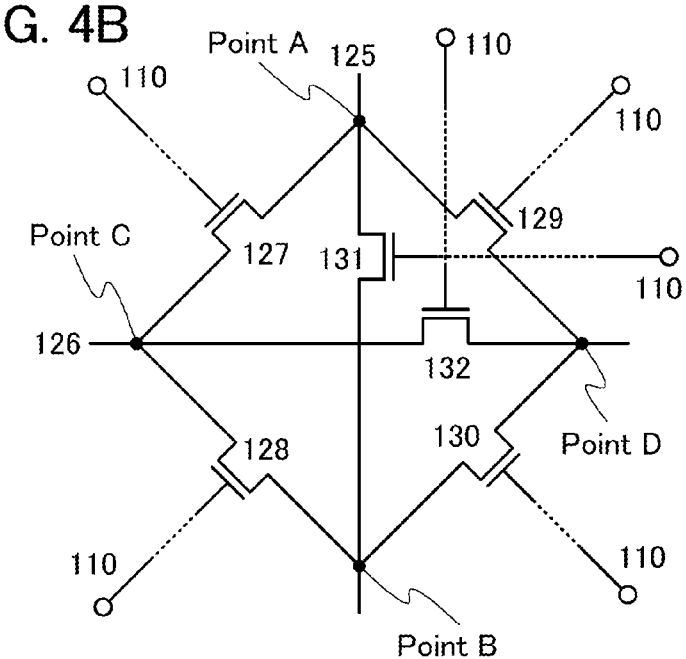

FIG. 4B illustrates a configuration example of the switch 122. The switch 122 illustrated in FIG. 4B has a function of controlling connections between a wiring 125 and a wiring 126 which belong to the wiring group 121. Specifically, the switch 122 includes transistors 127 to 132. The transistor 127 has a function of controlling electrical connection between a point A of the wiring 125 and a point C of the wiring 126. The transistor 128 has a function of controlling electrical connection between a point B of the wiring 125 and the point C of the wiring 126. The transistor 129 has a function of controlling electrical connection between the point A of the wiring 125 and a point D of the wiring 126. The transistor 130 has a function of controlling electrical connection between the point B of the wiring 125 and the point D of the wiring 126. The transistor 131 has a function of controlling electrical connection between the point A and the point B of the wiring 125. The transistor 132 has a function of controlling electrical connection between the point C and the point D of the wiring 126.

The selection between on and off (switching) of each of the transistors 127 to 132 is determined by the configuration data 105 that is held in the memory array 104. Specifically, in the PLD 100, gate electrodes of the transistors 127 to 132 are connected to the respective memory elements 103 through the nodes 110. In the semiconductor device 120, the gate electrodes of the transistors 127 to 132 are connected to the wiring 108 or the wiring 109 through the nodes 110.

The switches 122 also have a function of controlling electrical connection between the wiring group 121 and output terminals 124 of the logic array 102. The output terminals 124 are connected to a circuit group other than the logic array 102 and the memory array 104 included in the PLD 100.

Figure 5:
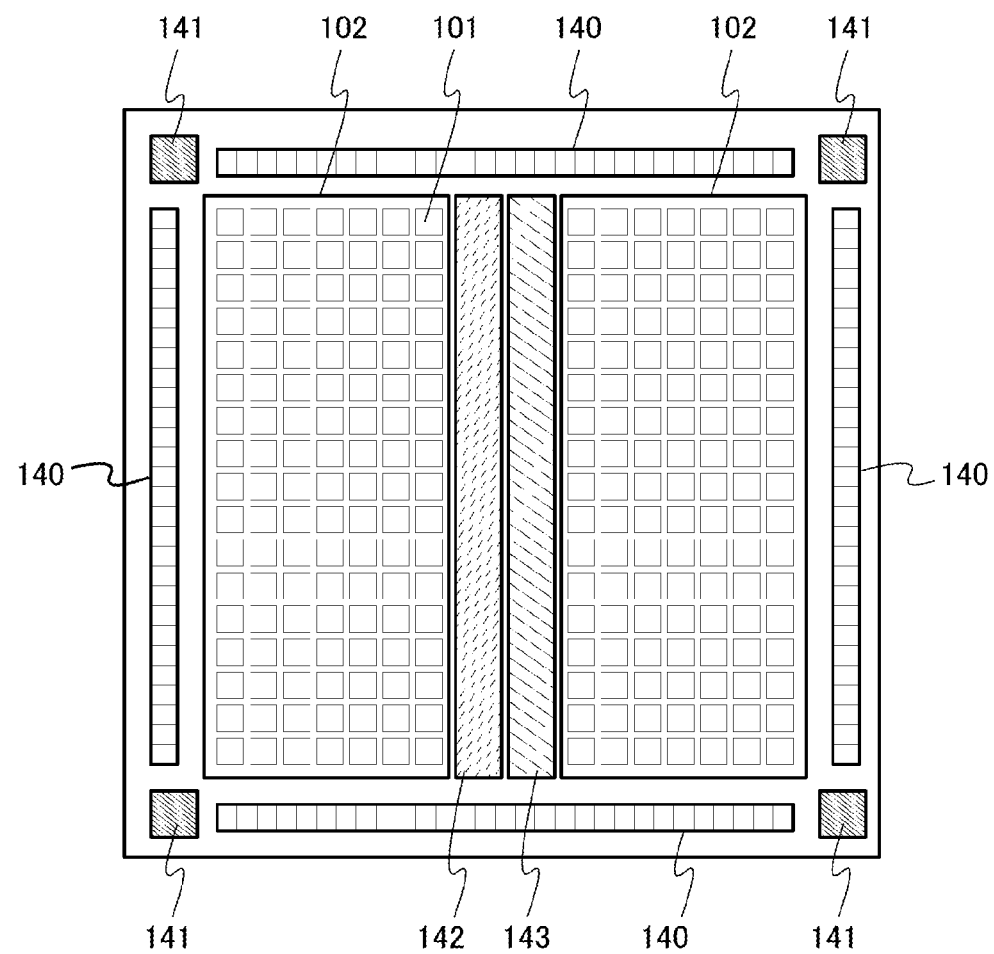
FIG. 5 illustrates a configuration of the lower layer of a programmable logic device.

FIG. 5 illustrates an example of the configuration of a layer under the memory array 104 in the PLD 100. In FIG. 5, I/O elements 140, phase lock loops (PLLs) 141, a RAM 142, and a multiplier 143 are provided besides the logic array 102 in the layer under the memory array 104. The I/O element 140 functions as an interface which controls input/output of a signal from/to an external circuit of the PLD 100. The PLL 141 has a function of generating a clock signal CLK. The RAM 142 has a function of storing data used for logic operation. The multiplier 143 corresponds to a logic circuit for multiplication. When the logic array 102 includes a function of executing multiplication, the multiplier 143 is not necessarily provided.

Figure 6A:
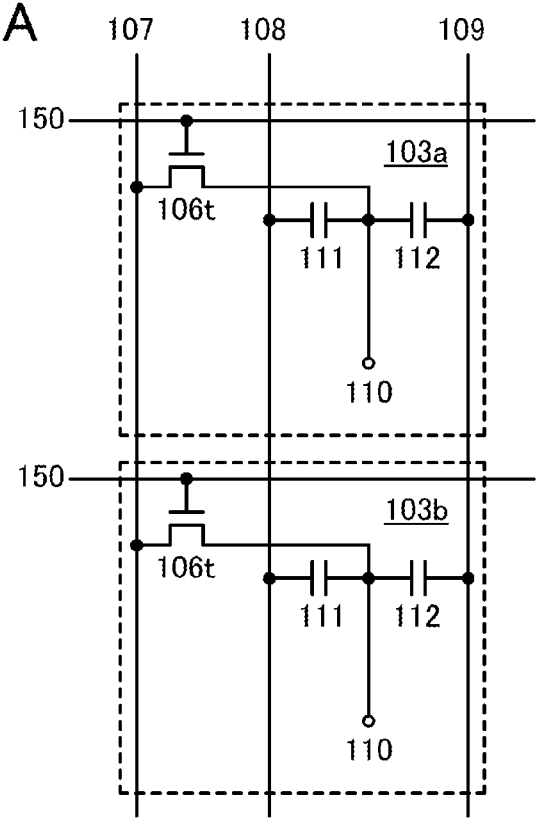
FIGS. 6A and 6B illustrate a configuration of a memory element and connection between a wiring and a node.

FIG. 6A schematically illustrates a specific configuration example of the memory element 103. Note that FIG. 6A illustrates the memory element 103a and the memory element 103b, which correspond to two of the plurality of memory elements 103.

As exemplified by the memory elements 103a and 103b in FIG. 6A, the memory element 103 includes a transistor 106t functioning as the switch 106, the wirings 107 to 109, and a wiring 150. Specifically, a gate electrode of the transistor 106t is connected to the wiring 150. One of a source terminal and a drain terminal of the transistor 106t is connected to the wiring 107, and the other is connected to the node 110.

Note that a "source terminal" of a transistor means a source region that is part of an active layer or a source electrode that is connected to an active layer. Similarly, "drain terminal" of a transistor means a drain region that is a part of an active layer or a drain electrode connected to an active layer.

The terms "source terminal" and "drain terminal" of a transistor interchange with each other depending on the type of the channel of the transistor or levels of potentials applied to the terminals. In general, in an n-channel transistor, a terminal to which a low potential is applied is called a source terminal, and a terminal to which a high potential is applied is called a drain terminal. Further, in a p-channel transistor, a terminal to which a low potential is applied is called a drain terminal, and a terminal to which a high potential is applied is called a source terminal. In this specification, although the connection relation of the transistor is described assuming that the source terminal and the drain terminal are fixed in some cases for convenience, actually, the names of the source terminal and the drain terminal interchange with each other depending on the relation of the potentials.

Capacitance is formed between the node 110 and each of the wirings 108 and 109. In FIG. 6A, the capacitance formed between the node 110 and the wiring 108 is shown as the capacitor 111, and the capacitance formed between the node 110 and the wiring 109 is shown as the capacitor 112. The configuration data 105 is output from the memory element 103 through the node 110.

Figure 6B:
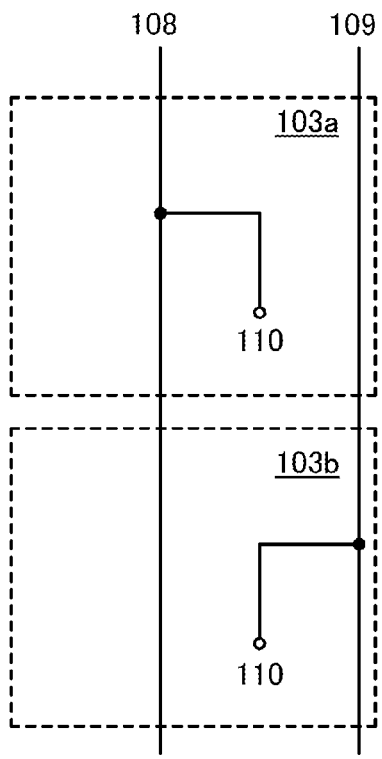

FIG. 6B illustrates a state where the memory elements 103a and 103b in FIG. 6A are each replaced with the wirings 108 and 109. In the case exemplified in FIG. 6B, the wiring 108 is selected from the wirings 108 and 109, which are provided instead of the memory element 103a, by the configuration data 105 to be connected to the node 110. Further, the wiring 109 is selected from the wirings 108 and 109, which are provided instead of the memory element 103b, by the configuration data 105 to be connected to the node 110.

Figure 7A:
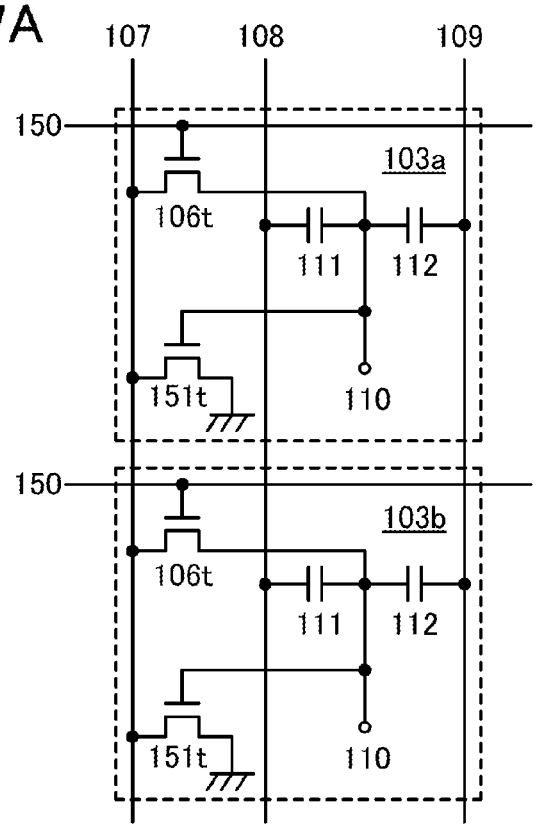
FIGS. 7A and 7B illustrate a configuration of a memory element and connection between a wiring and a node.

FIG. 7A schematically illustrates a specific configuration example of the memory element 103, which is different from that in FIG. 6A. Note that FIG. 7A illustrates the memory element 103a and the memory element 103b, which correspond to two of the plurality of memory elements 103.

As exemplified by the memory elements 103a and 103b in FIG. 7A, the memory element 103 includes the transistor 106t functioning as the switch 106, the wirings 107 to 109, the wiring 150, and a transistor 151t. Specifically, the gate electrode of the transistor 106t is connected to the wiring 150. One of the source terminal and the drain terminal of the transistor 106t is connected to the wiring 107, and the other is connected to the node 110. A gate electrode of the transistor 151t is connected to the node 110. One of a source terminal and a drain terminal of the transistor 151t is connected to the wiring 107, and the other is connected to a node to which a fixed potential such as a ground potential is supplied.

Capacitance is formed between the node 110 and each of the wirings 108 and 109. In FIG. 7A, the capacitance formed between the node 110 and the wiring 108 is shown as the capacitor 111, and the capacitance formed between the node 110 and the wiring 109 is shown as the capacitor 112. The configuration data 105 is output from the memory element 103 through the node 110. Further, in response to a request from an external circuit, the configuration data 105 held in the memory element 103 can be read out through the transistor 151t.

Figure 7B:
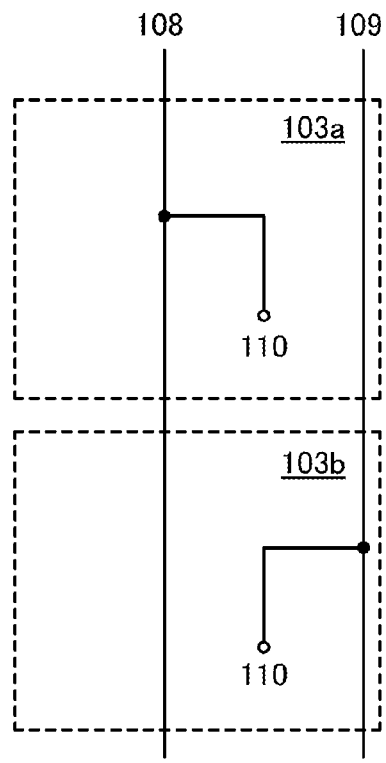

FIG. 7B illustrates a state where the memory elements 103a and 103b in FIG. 7A are each replaced with the wirings 108 and 109. In the case exemplified in FIG. 7B, the wiring 108 is selected from the wirings 108 and 109, which are provided instead of the memory element 103a, by the configuration data 105 to be connected to the node 110. Further, the wiring 109 is selected from the wirings 108 and 109, which are provided instead of the memory element 103b, by the configuration data 105 to be connected to the node 110.

Note that the memory element 103 exemplified in FIG. 6A or FIG. 7A may further include another circuit element such as a transistor, a diode, a resistor, a capacitor, or an inductor as needed.

FIG. 6A and FIG. 7A each illustrate the case where the transistor 106t includes the gate electrode only on one side of an active layer. When the transistor 106t includes a pair of gate electrodes between which the active layer is provided, one of the gate electrodes is supplied with a signal for controlling switching, and the other of the gate electrodes may be in a floating state (i.e., electrically isolated) or may be supplied with a potential. In the latter case, potentials with the same level may be supplied to the pair of electrodes, or a fixed potential such as a ground potential may be supplied only to the other of the gate electrodes. By controlling the level of a potential supplied to the other of the gate electrodes, the threshold voltage of the transistor 106t can be controlled.

Further, in the memory element 103 exemplified in FIG. 6A or FIG. 7A, the transistor 106t is used as the switch 106; however, one embodiment of the present invention is not limited to this structure. A plurality of transistors may be used as the switch 106. In the case where a plurality of transistors function as the switch 106, the plurality of transistors may be connected to each other in parallel, in series, or in combination of parallel connection and series connection.

In this specification, a state in which transistors are connected to each other in series means, for example, a state in which only one of a source terminal and a drain terminal of a first transistor is connected to only one of a source terminal and a drain terminal of a second transistor. In addition, a state in which transistors are connected to each other in parallel means a state in which one of a source terminal and a drain terminal of a first transistor is connected to one of a source terminal and a drain terminal of a second transistor and the other of the source terminal and the drain terminal of the first transistor is connected to the other of the source terminal and the drain terminal of the second transistor.

In one embodiment of the present invention, an amorphous, microcrystalline, polycrystalline, or single crystal semiconductor (e.g., silicon or germanium) or a wide bandgap semiconductor such as an oxide semiconductor may be used for the active layer of the transistor 106t. As silicon, any of the following can be used: amorphous silicon formed by a sputtering method or a vapor deposition method such as a plasma CVD method; polycrystalline silicon obtained in such a manner that amorphous silicon is crystallized by laser annealing or the like; single crystal silicon obtained in such a manner that a surface portion of a single crystal silicon wafer is separated by implantation of hydrogen ions or the like into the silicon wafer; and the like.

Note that in Non-Patent Document 1, according to FIG. 11 and FIG. 14, off-state current of TFTs which compose an SRAM is about 1 pA when the voltage (drain voltage) between a source terminal and a drain terminal is 3.3 V. Thus, in Non-Patent Document 1, a power $W_{SRAM}$ consumed by the SRAM for holding data can be estimated to be about 6.6 pW.

The capacitance value of a capacitor that is used in a general DRAM is said to be about 20 fF (Y. Yanagawa, T. Sekiguchi, A. Kotabe, K. Ono, and R. Takemura, "In-substrate-bitline Sense Amplifier with Array-noise-gating Scheme for Low-noise $4F^2$ DRAM Array Operable at 10-fF Cell Capacitance", 2011 Symposium on VLSI Circuits Digest of Technical Papers, pp. 230-231). Parasitic capacitance of a wiring which allows the amount of charge held in the capacitor to be read out is estimated to be about 1 pF, which is 50 times 20 fF, at most. Considered is the case where, in a memory array according to one embodiment of the present invention, a capacitance value $C_{107}$ of parasitic capacitance applied to the wiring 107 is 1 pF, a high-level potential $V_{data}$ of a signal including configuration data is 3.3 V, and refreshing is performed N times every second. In this case, a power $W_{107}$ consumed for setting the potential of the wiring 107 to $V_{data}$ is represented by $(1/2) \times C_{107} \times V_{data}^2 \times N$, and can be estimated to be about 5.4N pW. Accordingly, it is necessary to set N smaller than about 1.2, that is, to set the refresh interval (refresh cycle) t longer than about 0.8 seconds, in order to make the consumed power $W_{107}$ smaller than the consumed power $W_{SRAM}$.

Considered is the case where, in the memory array according to one embodiment of the present invention, a high-level power supply potential VDD that is supplied to the memory element 103 through the wiring 108 is set to 3.3 V and refreshing is performed when the potential of the node 110 falls to half of 3.3 V. A capacitance value $C_{111}$ of the capacitor 111 is set to 20 fF, which is equivalent to that in a general DRAM. When the off-state current of the transistor 106$t$ is represented by $I_{off}$ and the refresh interval (refresh cycle) is represented by t, t=$C_{111}$×VDD×(1/2)/$I_{off}$=33 fF/$I_{off}$ is satisfied. Accordingly, it is necessary to set $I_{off}$ smaller than about 40 fA in order to make t longer than about 0.8 seconds.

In one embodiment of the present invention, the off-state current of a transistor used as the switch 106 is smaller than 40 fA when the drain voltage is 3.3 V; thus, charge held in the node 110 does not easily leak, which allows extension of the interval between operations of writing the configuration data that is stored in the memory array 104 into the memory array 104 again (refreshing). When the refresh interval is long, i.e., the frequency of refreshing per unit time is low, power consumed for the refreshing can be reduced, so that power consumption of the semiconductor device 120 that is manufactured based on the PLD 100 can be estimated accurately at the stage of testing the PLD 100.

Note that when the transistor 106$t$ includes a wide bandgap semiconductor such as an oxide semiconductor in a channel formation region, the transistor 106$t$ can have extremely small off-state current and high withstand voltage. Further, when the transistor 106$t$ having the above structure is used as the switch 106 of the memory element 103, leakage of charge accumulated in the node 110, the capacitor 111, and the capacitor 112 can be prevented effectively as compared with the case where a transistor including a normal semiconductor such as silicon or germanium is used.

Unless otherwise specified, in the case of an n-channel transistor, the off-state current in this specification is a current which flows between a source terminal and a drain terminal when, in the state where the potential of the drain terminal is higher than that of the source terminal and that of a gate electrode, the potential of the gate electrode is lower than or equal to 0 V with respect to the potential of the source terminal. Alternatively, in this specification, in the case of a p-channel transistor, the off-state current is a current which flows between a source terminal and a drain terminal when, in the state where the potential of the drain terminal is lower than that of the source terminal and that of a gate electrode, the potential of the gate electrode is higher than or equal to 0 V with respect to the potential of the source terminal.

An oxide semiconductor preferably contains at least indium (In) or zinc (Zn). As a stabilizer for reducing variations in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that, for example, an In—Ga—Zn-based oxide means an oxide containing In, Ga, and Zn, and there is no limitation on the ratio of In, Ga, and Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

For example, high mobility can be obtained relatively easily in the case of using an In—Sn—Zn-based oxide. However, mobility can be increased by reducing the defect density in a bulk also in the case of using an In—Ga—Zn-based oxide.

Note that a highly purified oxide semiconductor (a purified oxide semiconductor) obtained by reduction of impurities such as moisture or hydrogen which serve as electron donors (donors) and reduction of oxygen vacancies is an intrinsic (i-type) semiconductor or a substantially i-type semiconductor. Therefore, a transistor including the oxide semiconductor has significantly small off-state current. Furthermore, the band gap of the oxide semiconductor is 2 eV or more, preferably 2.5 eV or more, further preferably 3 eV or more. By using an oxide semiconductor film which is highly purified by a sufficient reduction in the concentration of impurities such as moisture and hydrogen and a reduction of oxygen vacancies, the off-state current of the transistor can be reduced.

Specifically, various experiments can prove small off-state current of a transistor in which a highly purified oxide semiconductor is used for a semiconductor film. For example, even a transistor with a channel width of 1×10$^6$ μm and a channel length of 10 μm can have off-state current less than or equal to the measurement limit of a semiconductor parameter analyzer, that is, less than or equal to 1×10$^{-13}$ A when the voltage (drain voltage) between a source terminal and a drain terminal ranges between 1 V and 10 V. In this case, off-state current standardized on the channel width of the transistor is less than or equal to 100 zA/μm. Accordingly, it is possible to make the off-state current of the transistor in which an oxide semiconductor is used for a semiconductor film smaller than 40 fA by setting the channel width smaller than 4×10$^5$ μm. In addition, a capacitor and a transistor are connected to each other and the off-state current is measured with a circuit in which charge flowing into or from the capacitor is controlled by the transistor. In the measurement, a highly purified oxide semiconductor film is used for a channel formation region of the transistor, and the off-state current of the transistor is measured from a change in the amount of charge of the capacitor per unit time. As a result, it can be seen that, in the case where the voltage between the source terminal and the drain terminal of the transistor is 3 V, a smaller off-state current of several tens of yoctoamperes per micrometer (yA/μm) is obtained. Accordingly, the transistor in which a highly purified oxide semiconductor film is used for a channel formation region has much smaller off-state current than a transistor including crystalline silicon.

In one embodiment of the present invention, the use of the transistor 106t with extremely small off-state current enables leakage of charge from the node 110, the capacitor 111, and the capacitor 112 to be prevented. Accordingly, power consumption of the memory array 104 due to the off-state current of a transistor can be reduced as compared with the case where an SRAM composed of polysilicon TFTs is used. Therefore, power consumption of the semiconductor device 120 that is manufactured based on the PLD 100 can be estimated accurately at the stage of testing the PLD 100.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film is not absolutely amorphous. The CAAC-OS film, for example, includes an oxide semiconductor with a crystal-amorphous mixed phase structure where crystal parts and amorphous parts are intermingled. Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

For example, the CAAC-OS film is formed by a sputtering method with a polycrystalline metal oxide target. By collision of ions with the target, a crystal region included in the target may be separated from the target along an a-b plane; in other words, a sputtered particle having a plane parallel to an a-b plane (flat-plate-like sputtered particle or pellet-like sputtered particle) may flake off from the target. In that case, the flat-plate-like sputtered particle reaches a substrate while maintaining its crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the target, an In—Ga—Zn-based oxide target is described below.

The In—Ga—Zn-based oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to GaOy powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired target.

Embodiment 2

In this embodiment, a configuration example of the memory array 104 is described.

Figure 8:
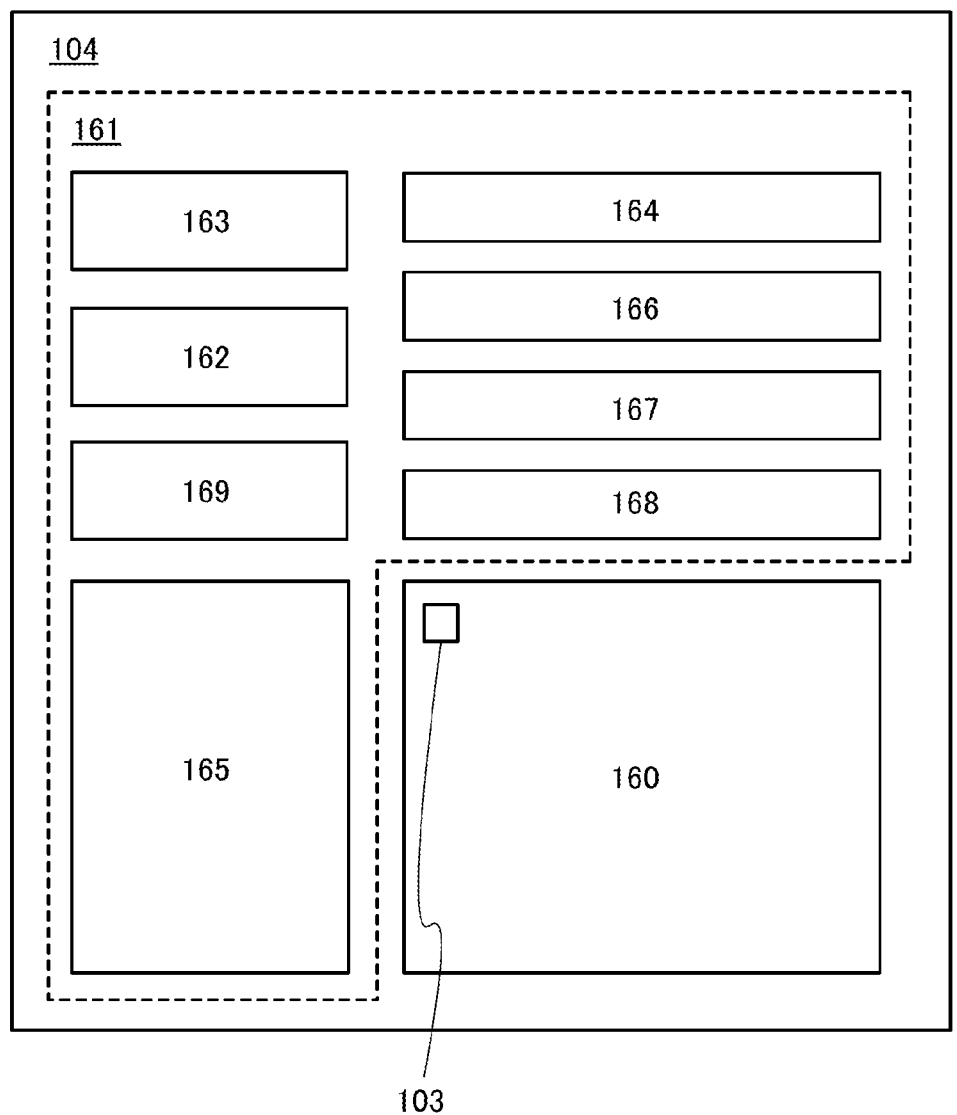
FIG. 8 is a block diagram illustrating a configuration of a memory array.

FIG. 8 is a block diagram illustrating a configuration example of the memory array 104. Note that in the block diagram in FIG. 8, circuits in the memory array 104 are classified in accordance with their functions and separated blocks are illustrated. However, it is difficult to classify actual circuits according to their functions completely and it is possible for one circuit to have a plurality of functions.

The memory array 104 illustrated in FIG. 8 includes a cell array 160 including the plurality of memory elements 103 and a driver circuit 161. The driver circuit 161 includes an input-output buffer 162, a main amplifier 163, a column decoder 164, a row decoder 165, a switch circuit 166, a precharge circuit 167, a sense amplifier 168, and a writing circuit 169.

The input-output buffer 162 has a function of controlling input of various signals to be used for driving the driver circuit 161 or the cell array 160 and configuration data to be written into the cell array 160 to the memory array 104. The input-output buffer 162 also has a function of controlling output of configuration data read out from the cell array 160 from the memory array 104.

In the case of the memory element 103 illustrated in FIG. 6A, for example, the row decoder 165 has a function of selecting the memory elements 103 of the cell array 160 per row in accordance with a specified address by controlling the potential supplied to the wiring 150. The column decoder 164 has a function of performing selection of the memory elements 103 in a column direction at the time of writing or readout of configuration data in accordance with a specified address by controlling the operation of the switch circuit 166.

In the case of the memory element 103 illustrated in FIG. 6A, for example, the switch circuit 166 has a function of establishing connection between the wiring 107 and the main amplifier 163 and connection between the wiring 107 and the writing circuit 169. The writing circuit 169 has a function of writing configuration data into the memory element 103 of a specified address via the switch circuit 166.

The sense amplifier 168 has a function of amplifying a change in the potential of the wiring 107 at the time of reading out configuration data from the memory element 103. The sense amplifier 168 also has a function of temporarily storing configuration data that is written into the memory element 103 or configuration data that is read out from the memory element 103.

The main amplifier 163 has a function of reading out configuration data using the potential of the wiring 107 which is amplified by the sense amplifier 168. The precharge circuit 167 has a function of resetting the potential of the wiring 107 before reading out configuration data.

Note that the memory array 104 may include an address buffer which can temporarily store the address of the specified memory element 103.

In one embodiment of the present invention, the memory array 104 does not necessarily include the driver circuit 161; the driver circuit 161 may be provided outside the PLD. It is also possible to provide the driver circuit 161 in the same layer as the logic array 102 and provide the cell array 160 over the driver circuit 161 and the logic array 102.

Figure 9:
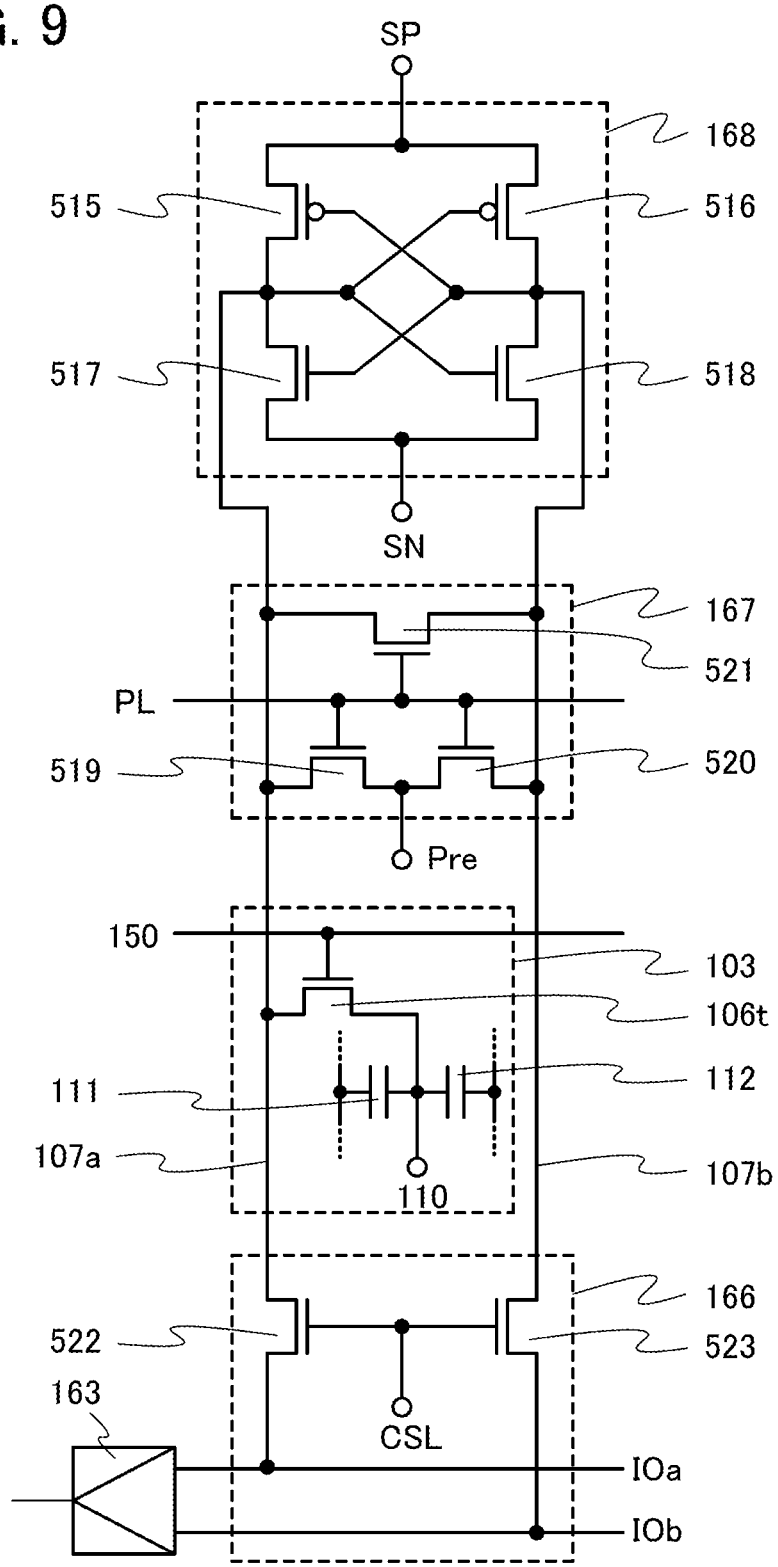
FIG. 9 illustrates connections between a memory element, a sense amplifier, a precharge circuit, a switch circuit, and a main amplifier.

Next, connections between the sense amplifier 168, the precharge circuit 167, the switch circuit 166, and the main amplifier 163 which are assigned to the memory elements 103 of one column are exemplified in FIG. 9. FIG. 9 illustrates one of the memory elements 103 in FIG. 6A as an example.

The memory element 103 includes the transistor 106t, the capacitor 111, and the capacitor 112. The memory element 103 is connected to a wiring 107a. The sense amplifier 168, the precharge circuit 167, and the switch circuit 166 are connected to the wiring 107a and a wiring 107b. The wirings 107a and 107b correspond to two of the plurality of wirings 107 connected to the plurality of memory elements 103. Note that all the memory elements 103 connected to the wirings 107a and 107b are connected to different wirings 150.

Specifically, FIG. 9 illustrates the case where the sense amplifier 168 is a latch sense amplifier. The sense amplifier 168 includes p-channel transistors 515 and 516 and n-channel transistors 517 and 518. One of a source terminal and a drain terminal of the transistor 515 is connected to a terminal SP and the other is connected to gate electrodes of the transistors 516 and 518 and the wiring 107a. One of a source terminal and a drain terminal of the transistor 517 is connected to the gate electrodes of the transistors 516 and 518 and the wiring 107a and the other is connected to a terminal SN. One of a source terminal and a drain terminal of the transistor 516 is connected to the terminal SP and the other is connected to gate electrodes of the transistors 515 and 517 and the wiring 107b. One of a source terminal and a drain terminal of the transistor 518 is connected to the gate electrodes of the transistors 515 and 517 and the wiring 107b and the other is connected to the terminal SN.

The precharge circuit 167 includes n-channel transistors 519 to 521. The transistors 519 to 521 may be p-channel transistors. One of a source terminal and a drain terminal of the transistor 519 is connected to the wiring 107a and the other is connected to a terminal Pre. One of a source terminal and a drain terminal of the transistor 520 is connected to the wiring 107b and the other is connected to the terminal Pre. One of a source terminal and a drain terminal of the transistor 521 is connected to the wiring 107a and the other is connected to the wiring 107b. Gate electrodes of the transistors 519 to 521 are connected to a wiring PL.

The switch circuit 166 includes n-channel transistors 522 and 523. The transistors 522 and 523 may be p-channel transistors. One of a source terminal and a drain terminal of the transistor 522 is connected to the wiring 107a and the other is connected to a wiring IOa. One of a source terminal and a drain terminal of the transistor 523 is connected to the wiring 107b and the other is connected to a wiring IOb. Gate electrodes of the transistors 522 and 523 are connected to a terminal CSL. The potential of the terminal CSL is controlled by the column decoder 164.

The wirings IOa and IOb are connected to the main amplifier 163. The writing circuit 169 has a function of supplying potential to the wirings IOa and IOb in accordance with configuration data.

The sense amplifier 168 is not limited to the above latch sense amplifier, and may be a current-mirror sense amplifier or a single-end sense amplifier. In the case where the sense amplifier 168 is a single-end sense amplifier, the potential of the wiring 107b need not be reset; thus, the transistors 520 and 521 in the precharge circuit 167 can be omitted.

The combination of the wirings 107a and 107b can be determined as appropriate in accordance with an array structure. In one embodiment of the present invention, an array structure such as a folded bit line structure, a cross-point structure, or an open bit line structure can be used, and two of the plurality of wirings 107 connected to the plurality of memory elements 103 are connected to the main amplifier 163 and the switch circuit 166 in accordance with the array structure. Note that as mentioned above, all the memory elements 103 connected to the wirings 107a and 107b are connected to different wirings 150.

Next, an example of the operation of the memory element 103, the sense amplifier 168, the precharge circuit 167, the switch circuit 166, and the main amplifier 163 illustrated in FIG. 9 at the time of reading out configuration data is described with reference to a timing chart shown in FIG. 10.

First, in a period T1, the transistors 519 to 521 included in the precharge circuit 167 are turned on and the potentials of the wirings 107a and 107b are reset. Specifically, in this embodiment, a high-level potential VH_PL is supplied to the wiring PL, so that the transistors 519 to 521 in the precharge circuit 167 are turned on. In this manner, a potential Vpre of the terminal Pre is supplied to the wirings 107a and 107b.

Note that in the period T1, a low-level potential VL_CSL is supplied to the terminal CSL; thus, the transistors 522 and 523 in the switch circuit 166 are in an off state. Further, a low-level potential VL_WL is supplied to the wiring 150 (correspond to WL in FIG. 10); thus, the transistor 106t in the memory element 103 is in an off state. The potential Vpre is supplied to the terminal SP and the terminal SN; thus, the sense amplifier 168 is in an off state.

Then, a low-level potential VL_PL is supplied to the wiring PL, so that the transistors 519 to 521 in the precharge circuit 167 are turned off. In a period T2, the wiring 150 is selected. Specifically, in this embodiment, a high-level potential VH_WL is supplied to the wiring 150, so that the wiring 150 is selected and the transistor 106t in the memory element 103 is turned on. In this manner, the capacitors 111 and 112 are connected to the wiring 107a through the transistor 106t. When the capacitors 111 and 112 are electrically connected to the wiring 107a, the potential of the wiring 107a changes depending on the amount of charge held in the capacitors 111 and 112.

The timing chart in FIG. 10 shows, as an example, the case where the amount of charge accumulated in the capacitors 111 and 112 is large. Specifically, when the amount of charge accumulated in the capacitors 111 and 112 is large, charge is released to the wiring 107a from the capacitors 111 and 112, so that the potential of the wiring 107a rises from the potential Vpre by $\Delta V1$. On the other hand, when the amount of charge accumulated in the capacitors 111 and 112 is small, charge flows into the capacitors 111 and 112 from the wiring 107a, so that the potential of the wiring 107a falls from the potential Vpre by $\Delta V2$.

In the period T2, the low-level potential VL_CSL is still supplied to the terminal CSL; thus, the transistors 522 and 523 in the switch circuit 166 remain in an off state. Further, the potential Vpre is still supplied to the terminal SP and the terminal SN; thus, the sense amplifier 168 remains in an off state.

Next, in a period T3, a high-level potential VH_SP is supplied to the terminal SP and a low-level potential VL_SN is supplied to the terminal SN, so that the sense amplifier 168 is turned on. The sense amplifier 168 has a function of amplifying the potential difference between the wirings 107a and 107b ($\Delta V1$ in FIG. 10). Accordingly, in the case of the timing chart in FIG. 10, when the sense amplifier 168 is turned on, the potential of the wiring 107a rises from the potential Vpre+$\Delta V1$ to approach the potential VH_SP of the terminal SP. In addition, the potential of the wiring 107b falls from the potential Vpre to approach the potential VL_SN of the terminal SN.

Note that in the case where the potential of the wiring 107a is Vpre−$\Delta V2$ at the beginning of the period T3, when the sense amplifier 168 is turned on, the potential of the wiring 107a falls from the potential Vpre−$\Delta V2$ to approach the potential VL_SN of the terminal SN. In addition, the potential of the wiring 107b rises from the potential Vpre to approach the potential VH_SP of the terminal SP.

In the period T3, the low-level potential VL_PL is still supplied to the wiring PL, so that the transistors 519 to 521 in the precharge circuit 167 remain in an off state. Further, the low-level potential VL_CSL is still supplied to the terminal CSL; thus, the transistors 522 and 523 in the switch circuit 166 remain in an off state. The high-level potential VH_WL is still supplied to the wiring 150; thus, the transistor 106t in the memory element 103 remains in an on state.

Next, in a period T4, the switch circuit 166 is turned on by control of the potential supplied to the terminal CSL. Specifically, in this embodiment, a high-level potential VH_CSL is supplied to the terminal CSL, so that the transistors 522 and 523 in the switch circuit 166 are turned on. In this manner, the potential of the wiring 107a and the potential of the wiring 107b are supplied to the main amplifier 163 through the wirings IOa and IOb. The level of a potential Vout that is output from the main amplifier 163 differs depending on whether the potential of the wiring IOa is high or low compared with the potential of the wiring IOb. This means that a signal including the potential Vout includes configuration data.

In the period T4, the low-level potential VL_PL is still supplied to the wiring PL, so that the transistors 519 to 521 in the precharge circuit 167 remain in an off state. The high-level potential VH_WL is still supplied to the wiring 150; thus, the transistor 106*t* in the memory element 103 remains in an on state. The high-level potential VH_SP is still supplied to the terminal SP and the low-level potential VL_SN is still supplied to the terminal SN; thus, the sense amplifier 168 remains in an on state.

When the period T4 ends, the switch circuit 166 is turned off by control of the potential supplied to the terminal CSL. Specifically, in this embodiment, the low-level potential VL_CSL is supplied to the terminal CSL, so that the transistors 522 and 523 in the switch circuit 166 are turned off. In addition, the selection of the wiring 150 is terminated. Specifically, in this embodiment, the low-level potential VL_WL is supplied to the wiring 150, so that the wiring 150 is deselected and the transistor 106*t* in the memory element 103 is turned off.

Configuration data is read out from the memory element 103 by the above operation through the periods T1 to T4.

In the case where the read out configuration data is written into the memory element 103 again, the sense amplifier 168 is kept in an on state after the configuration data is read out until writing of the configuration data is performed again. In this manner, the potentials of the wirings 107*a* and 107*b* are held by the sense amplifier 168 even after the configuration data is read out. The transistors 522 and 523 in the switch circuit 166 are turned off after the configuration data is read out. Then, the wiring 150 is selected and the transistor 106*t* is turned on, so that the capacitors 111 and 112 are connected to the wiring 107*a*. Charge is accumulated in the capacitors 111 and 112 in accordance with the potential of the wiring 107*a*, whereby the read out configuration data is written into the memory element 103 again.

In the case where new configuration data is written into the memory element 103 from the writing circuit 169, first, the high-level potential VH_SP is supplied to the terminal SP and the low-level potential VL_SN is supplied to the terminal SN, so that the sense amplifier 168 is turned on. Then, the potentials of the wirings IOa and IOb are set to levels corresponding to the configuration data under the control of the writing circuit 169, and the transistors 522 and 523 in the switch circuit 166 are turned on. In this manner, the potential of the wiring IOa is supplied to the wiring 107*a*, and the potential of the wiring IOb is supplied to the wiring 107*b*. Then, the wiring 150 is selected and the transistor 106*t* is turned on, so that the capacitors 111 and 112 are connected to the wiring 107*a*. Charge is accumulated in the capacitors 111 and 112 in accordance with the potential of the wiring 107*a*, whereby the configuration data is written into the memory element 103.

Note that after the potential of the wiring IOa is supplied to the wiring 107*a* and the potential of the wiring IOb is supplied to the wiring 107*b*, the relation in level between the potential of the wiring 107*a* and the potential of the wiring 107*b* is kept by the sense amplifier 168 as long as the sense amplifier is in an on state even after the transistors 522 and 523 in the switch circuit 166 are turned off. Therefore, the timing of switching the transistors 522 and 523 from an on state to an off state in the switch circuit 166 may be either before or after the selection of the wiring 150.

This embodiment can be implemented in appropriate combination with any of the other embodiments.

Embodiment 3

In this embodiment, a configuration example of the LUT 113 included in the PLE 101 is described. The LUT 113 can be composed of a plurality of multiplexers. Configuration data 105 can be input to any of input terminals and control terminals of the plurality of multiplexers.

Figure 11A:
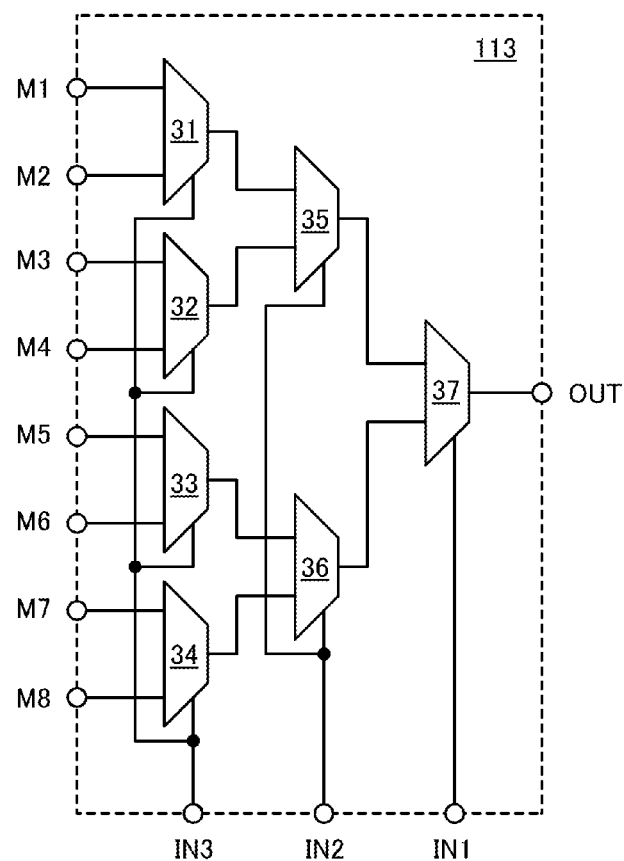
FIGS. 11A to 11C are circuit diagrams of a look-up table.

FIG. 11A illustrates one mode of the LUT 113 included in the PLE 101.

In FIG. 11A, the LUT 113 is composed of seven two-input multiplexers (a multiplexer 31, a multiplexer 32, a multiplexer 33, a multiplexer 34, a multiplexer 35, a multiplexer 36, and a multiplexer 37). Input terminals of the multiplexers 31 to 34 correspond to input terminals M1 to M8 of the LUT 113.

Control terminals of the multiplexers 31 to 34 are electrically connected to each other and correspond to an input terminal IN3 of the LUT 113. Output terminals of the multiplexers 31 and 32 are electrically connected to two input terminals of the multiplexer 35. Output terminals of the multiplexers 33 and 34 are electrically connected to two input terminals of the multiplexer 36. Control terminals of the multiplexers 35 and 36 are electrically connected to each other and correspond to an input terminal IN2 of the LUT 113. Output terminals of the multiplexers 35 and 36 are electrically connected to two input terminals of the multiplexer 37. A control terminal of the multiplexer 37 corresponds to an input terminal IN1 of the LUT 113. An output terminal of the multiplexer 37 corresponds to an output terminal OUT of the LUT 113.

When configuration data 105 is input from the memory element 103 to the input terminals M1 to M8, the kind of logic operation performed by the LUT 113 can be determined.

Figure 11B:
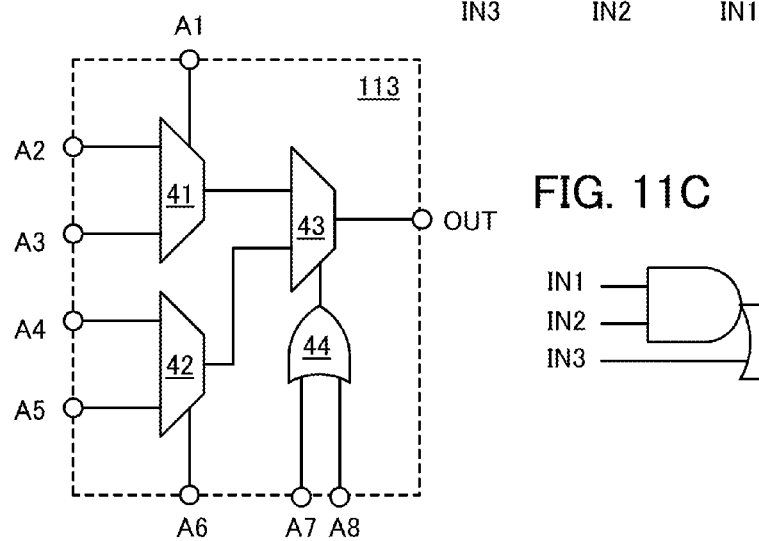
Figure 11C:
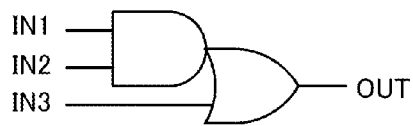

For example, in the case where configuration data 105 (digital values "0", "1", "0", "1", "0", "1", "1", and "1") is input to the input terminals M1 to M8 of the LUT 113 in FIG. 11A, the function of an equivalent circuit in FIG. 11C can be obtained.

FIG. 11B illustrates another mode of the LUT 113 included in the PLE 101.

In FIG. 11B, the LUT 113 is composed of three two-input multiplexers (a multiplexer 41, a multiplexer 42, and a multiplexer 43) and a two-input OR circuit 44.

Output terminals of the multiplexers 41 and 42 are electrically connected to two input terminals of the multiplexer 43. An output terminal of the OR circuit 44 is electrically connected to a control terminal of the multiplexer 43. An output terminal of the multiplexer 43 corresponds to the output terminal OUT of the LUT 113.

When configuration data 105 is input from the memory element 103 to any of a control terminal A1, an input terminal A2, and an input terminal A3 of the multiplexer 41, a control terminal A6, an input terminal A4, and an input terminal A8 of the multiplexer 42, and an input terminal A7 and an input terminal A8 of the OR circuit 44, the kind of logic operation performed by the LUT 113 can be determined.

For example, in the case where configuration data 105 (digital values "0", "1", "0", "0", and "0") is input to the input terminal A2, the input terminal A4, the input terminal A5, the control terminal A6, and the input terminal A8 of the LUT 113 from the memory elements 103 in FIG. 11B, the function of the equivalent circuit in FIG. 11C can be obtained. In the above configuration, the control terminal A1, the input terminal A3, and the input terminal A7 correspond to the input terminal IN1, the input terminal IN2, and the input terminal IN3, respectively.

Note that FIGS. 11A and 11B each illustrate an example of the LUT 113 composed of two-input multiplexers; however, the LUT 113 may be composed of multiplexers with three or more inputs.

The LUT 113 may further include any of or all of a diode, a resistor, a logic circuit (or a logic element), and a switch in addition to the multiplexers. As the logic circuit (or the logic element), a buffer, an inverter, a NAND circuit, a NOR circuit, a three-state buffer, a clocked inverter, or the like can be used. As the switch, an analog switch, a transistor, or the like can be used, for example.

Although the case where three-input and one-output logic operation as illustrated in FIG. 11C is performed using the LUT 113 illustrated in FIG. 11A or FIG. 11B is described, this embodiment is not limited thereto. When the LUT 113 and configuration data 105 to be input are determined as appropriate, logic operation with four or more inputs and two or more outputs can be performed.

This embodiment can be implemented in appropriate combination with any of the other embodiments.

Embodiment 4

In this embodiment, a method for manufacturing a PLD and a method for manufacturing a semiconductor device will be described by giving an example in which an oxide semiconductor is used for an active layer of the transistor 106t in the memory element 103 illustrated in FIG. 6A and silicon is used for an active layer of a transistor 230 included in a programmable logic element.

Besides silicon, a semiconductor material such as germanium, silicon germanium, or single crystal silicon carbide may be used for the transistor 230 included in the programmable logic element. For example, the transistor including silicon can be formed using a single crystal semiconductor substrate such as a silicon wafer, a silicon thin film which is formed by an SOI method, a silicon thin film which is formed by a vapor deposition method, or the like.

Figure 12A:
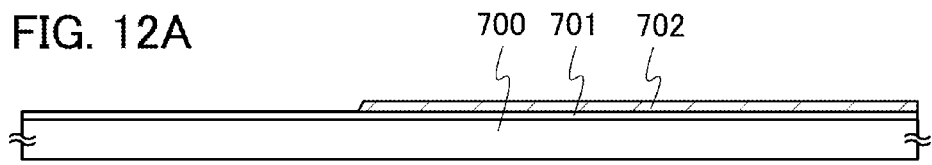
FIGS. 12A to 12D illustrate a method for manufacturing a PLD.

In this embodiment, first, as illustrated in FIG. 12A, an insulating film 701 and a single crystal semiconductor film 702 are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. As the glass substrate, in the case where the temperature of heat treatment to be performed later is high, a glass substrate having a strain point of 730° C. or higher is preferably used.

In this embodiment, a method for manufacturing the transistor included in the programmable logic element is described by giving an example in which the semiconductor film 702 is formed using single crystal silicon. Note that a specific example of a method for forming the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately 1 N/cm$^2$ to 500 N/cm$^2$, preferably 11 N/cm$^2$ to 20 N/cm$^2$ is applied to part of the bond substrate and part of the substrate 700 so that the substrates are attached to each other. When the pressure is applied, bonding between the bond substrate and the insulating film 701 starts from the parts, which results in bonding of the entire surface where the bond substrate and the insulating film 701 are in close contact with each other. Subsequently, heat treatment is performed, so that microvoids that exist in the fragile layer are combined and the microvoids increase in volume. Accordingly, a single crystal semiconductor film which is part of the bond substrate is separated from the bond substrate along the fragile layer. The heat treatment is performed at a temperature not exceeding the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not patterned or may be added to the patterned semiconductor film 702. Alternatively, the impurity element for controlling the threshold voltage may be added to the bond substrate. Further alternatively, the impurity element may be added to the bond substrate in order to roughly control the threshold voltage, and the impurity element may be further added to the semiconductor film which is not patterned or the patterned semiconductor film 702 in order to finely control the threshold voltage.

Note that although an example in which a single crystal semiconductor film is used is described in this embodiment, the present invention is not limited to this structure. For example, a polycrystalline, microcrystalline, or amorphous semiconductor film which is formed over the insulating film 701 by vapor deposition may be used. Alternatively, the semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be combined. When a heat-resistant substrate such as a quartz substrate is used, any of a thermal crystallization method using an electrically heated furnace, a lamp annealing crystallization method using infrared light, a crystallization method using a catalytic element, and a crystallization method using a high-temperature annealing method at approximately 950° C. may be used.

Figure 12B:
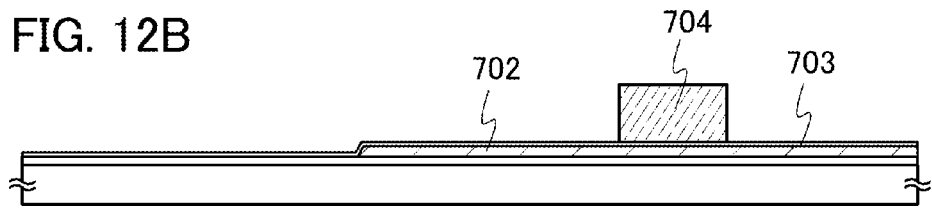

Next, as illustrated in FIG. 12B, a gate insulating film 703 is formed over the semiconductor film 702. Then, a gate electrode 704 is formed over the gate insulating film 703.

The gate insulating film 703 can be formed by oxidation or nitridation of a surface of the semiconductor film 702 by high-density plasma treatment, heat treatment, or the like. The high-density plasma treatment is performed, for example, by using a mixed gas of a rare gas such as He, Ar, Kr, or Xe, and oxygen, nitrogen oxide, ammonia, nitrogen, hydrogen, or the like. In this case, by exciting plasma by introduction of microwaves, plasma with a low electron temperature and high density can be generated. By oxidation or nitridation of the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed to be in contact with the semiconductor film. For example, a surface of the semiconductor film 702 is oxidized or nitrided using nitrous oxide ($N_2O$) diluted with Ar by 1 time to 3 times (flow rate ratio) by application of a microwave (2.45 GHz) power of 3 kW to 5 kW at a pressure of 10 Pa to 30 Pa. By this treatment, an insulating film having a thickness of 1 nm to 10 nm (preferably 2 nm to 6 nm) is formed. Further, nitrous oxide ($N_2O$) and silane ($SiH_4$) are introduced and a microwave (2.45 GHz) power of 3 kW to 5 kW is applied at a pressure of 10 Pa to 30 Pa so that a silicon oxynitride film is formed by a vapor deposition method, thereby forming the gate insulating film. With a combination of a solid-phase reaction and a reaction by a vapor deposition method, the gate insulating film with low interface state density and excellent withstand voltage can be formed.

The oxidation or nitridation of the semiconductor film by the high-density plasma treatment proceeds by solid-phase reaction. Thus, interface state density between the gate insulating film 703 and the semiconductor film 702 can be extremely low. Further, by direct oxidation or nitridation of the semiconductor film 702 by high-density plasma treatment, variation in the thickness of the insulating film to be formed can be suppressed. Moreover, in the case where the semiconductor film has crystallinity, the surface of the semiconductor film is oxidized with solid reaction by the high-density plasma treatment to restrain fast oxidation only in a crystal grain boundary; therefore, the gate insulating film with uniformity and low interface state density can be formed. Variations in the characteristics of a transistor whose gate insulating film partly or entirely includes an insulating film formed by high-density plasma treatment can be suppressed.

The gate insulating film 703 may be formed as a single layer or a stack of layers containing any of silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$, (x>0, y>0)) to which nitrogen is added, hafnium aluminate ($HfAl_xO_y$, (x>0, y>0)) to which nitrogen is added, and the like by a plasma CVD method, a sputtering method, or the like.

Note that in this specification, an oxynitride is a substance which includes more oxygen than nitrogen, and a nitride oxide is a substance which includes more nitrogen than oxygen.

The thickness of the gate insulating film 703 may be, for example, greater than or equal to 1 nm and less than or equal to 100 nm, preferably greater than or equal to 10 nm and less than or equal to 50 nm. In this embodiment, a single-layer insulating film containing silicon oxynitride with a thickness of about 20 nm formed by a plasma CVD method is used as the gate insulating film 703.

A conductive film is formed so as to cover the gate insulating film 703 and then is processed (patterned) into a predetermined shape, so that the gate electrode 704 can be formed. The conductive film can be formed by a CVD method, a sputtering method, a vapor deposition method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. Moreover, an alloy containing the above metal as the main component or a compound containing the above metal may be used. Alternatively, the conductive film may be formed using a semiconductor such as polycrystalline silicon doped with an impurity element such as phosphorus which imparts conductivity to the semiconductor film.

Note that the gate electrode 704 may be formed using a single-layer conductive film or a stack of a plurality of conductive films.

As a combination of two conductive films, tantalum nitride or tantalum can be used for a first conductive film and tungsten can be used for a second conductive film. Besides, the following combinations are given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two conductive films are formed. Alternatively, as the combination of the two conductive films, for example, nickel silicide and silicon doped with an impurity element which imparts n-type conductivity, tungsten silicide and silicon doped with an impurity element which imparts n-type conductivity, or the like can be used.

In the case of employing a three-layer structure in which three conductive films are stacked, a stacked-layer structure of a molybdenum film, an aluminum film, and a molybdenum film is preferable.

Further, a light-transmitting oxide conductive film of indium oxide, a mixture of indium oxide and tin oxide, a mixture of indium oxide and zinc oxide, zinc oxide, zinc aluminum oxide, zinc aluminum oxynitride, zinc gallium oxide, or the like can also be used as the gate electrode 704.

In this embodiment, the gate electrode 704 in which tungsten with a thickness of about 170 nm is stacked over tantalum nitride with a thickness of about 30 nm is used.

Alternatively, the gate electrode 704 may be selectively formed by a droplet discharge method without the use of a mask. A droplet discharge method is a method for forming a predetermined pattern by discharge or ejection of a droplet containing a predetermined composition from an orifice, and includes an inkjet method in its category.

In addition, the gate electrode 704 can be formed in such a manner that a conductive film is formed and then is etched by inductively coupled plasma (ICP) etching under appropriately controlled conditions (e.g., the amount of electric power applied to a coiled electrode layer, the amount of electric power applied to an electrode layer on the substrate side, and the electrode temperature on the substrate side) to have a desired tapered shape. Further, an angle and the like of the tapered shape may be controlled by the shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 12C:
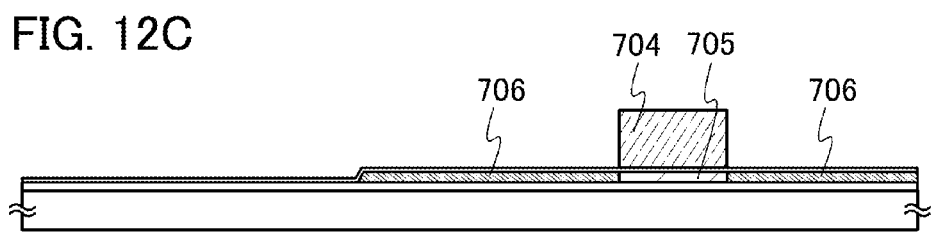

Next, an impurity element imparting one conductivity type is added to the semiconductor film 702 with the use of the gate electrode 704 as a mask, whereby a channel formation region 705 which overlaps with the gate electrode 704 and a pair of impurity regions 706 between which the channel formation region 705 is sandwiched are formed in the semiconductor film 702 as illustrated in FIG. 12C.

In this embodiment, the case where an impurity element which imparts n-type conductivity (e.g., phosphorus) is added to the semiconductor film 702 is described.

Figure 12D:
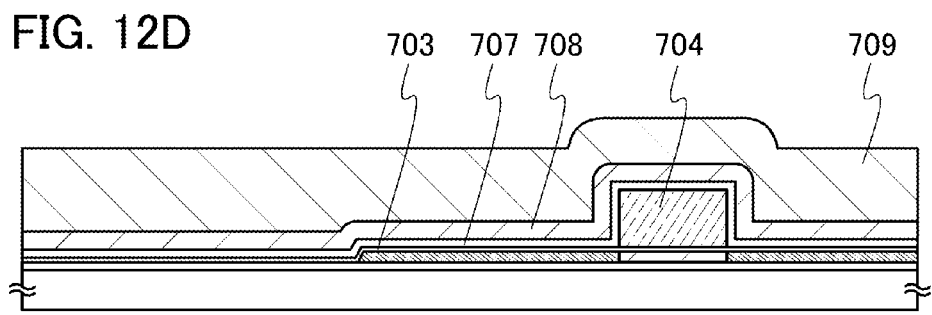

Next, as illustrated in FIG. 12D, an insulating film 707, an insulating film 708, and an insulating film 709 are formed to cover the gate insulating film 703 and the gate electrode 704. Specifically, an inorganic insulating film of silicon oxide, silicon nitride, silicon nitride oxide, silicon oxynitride, aluminum nitride, aluminum nitride oxide, or the like can be used as the insulating film 707, the insulating film 708, and the insulating film 709. In particular, the insulating film 707, the insulating film 708, and the insulating film 709 are preferably formed using a low dielectric constant (low-k) material because capacitance due to overlapping of electrodes or wirings can be sufficiently reduced. Note that a porous insulating film containing any of the above materials may be employed as the insulating film 707, the insulating film 708, and the insulating film 709. Since the porous insulating film has lower dielectric constant than a dense insulating film, parasitic capacitance due to electrodes or wirings can be further reduced.

In this embodiment, an example in which a 50-nm-thick silicon oxynitride film is used as the insulating film 707, a 100-nm-thick silicon nitride oxide film is used as the insulating film 708, and a 450-nm-thick silicon oxynitride film is used as the insulating film 709 is described. In addition, although an example in which the insulating film 707, the insulating film 708, and the insulating film 709 are formed over the gate electrode 704 is described in this embodiment, only one insulating film or a stack of two insulating films or four or more insulating films may be formed over the gate electrode 704.

Figure 13A:
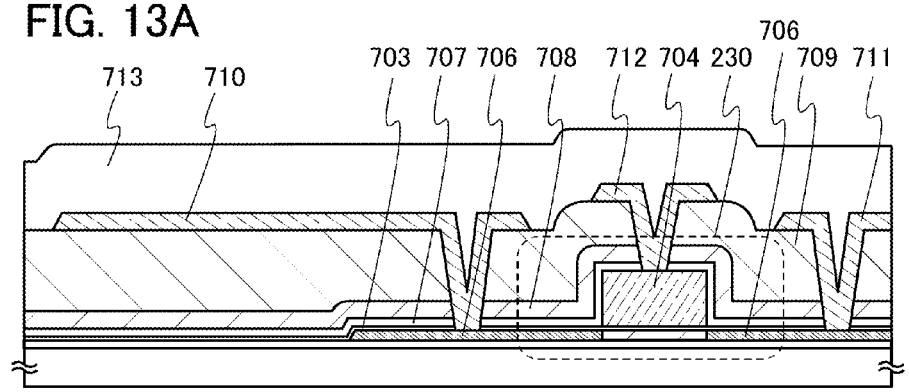
FIGS. 13A to 13C illustrate a method for manufacturing a PLD.

Next, as illustrated in FIG. 13A, openings are formed in the gate insulating film 703, the insulating film 707, the insulating film 708, and the insulating film 709 by etching or the like in order to expose part of the pair of the impurity regions 706 and part of the gate electrode 704; then, a conductive film 710 and a conductive film 711 which are in contact with the pair of the impurity regions 706 and a conductive film 712 which is in contact with the gate electrode 704 are formed. In addition, an insulating film 713 is formed over the insulating film 709 so as to cover the conductive films 710 to 712.

A conductive film which is to be the conductive films 710 to 712 can be formed using any of the following materials: an element selected from aluminum, chromium, copper, tantalum, titanium, molybdenum, and tungsten; an alloy containing any of these elements as a component; an alloy film containing any of these elements in combination; and the like. Alternatively, the conductive film may have a structure in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which is to be the conductive films 710 to 712 may have a single-layer structure or a stacked-layer structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given.

For the conductive film which is to be the conductive films 710 to 712, a conductive metal oxide may be used. As the conductive metal oxide, indium oxide, tin oxide, zinc oxide, a mixture of indium oxide and tin oxide, a mixture of indium oxide and zinc oxide, or the conductive metal oxide material to which silicon or silicon oxide is added can be used.

In this embodiment, a conductive film in which a titanium film with a thickness of about 50 nm, an aluminum film with a thickness of about 200 nm, and a titanium film with a thickness of about 100 nm are stacked is used for the conductive films 710 to 712.

The insulating film 713 may have either a single-layer structure or a stacked-layer structure of two or more layers, and preferably has a highly planar surface. As the insulating film 713, silicon oxide, silicon nitride, silicon oxynitride, or silicon nitride oxide can be used, for example. The insulating film 713 can be formed by a CVD method such as a plasma CVD method, a photo CVD method, or a thermal CVD method.

Further, as the insulating film 713, a silicon oxide film formed by chemical vapor deposition using organosilane can be used. For organosilane, tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), tris(dimethylamino)silane (chemical formula: $SiH(N(CH_3)_2)_3$), or the like can be used. It is needless to say that silicon oxide, silicon oxynitride, silicon nitride, silicon nitride oxide, or the like may be formed using inorganic silane such as monosilane, disilane, or trisilane.

In this embodiment, the insulating film 713 having a thickness of about 1.5 μm and containing silicon oxide is formed using TEOS.

Through the above process, the transistor 230 included in the programmable logic element can be formed. The transistor 230 includes the semiconductor film 702, the gate insulating film 703 over the semiconductor film 702, the gate electrode 704 formed to overlap with the semiconductor film 702 over the gate insulating film 703, and the conductive film 710 and the conductive film 711 which function as a source electrode and a drain electrode and are connected to the impurity regions 706 included in the semiconductor film 702.

Figure 13B:
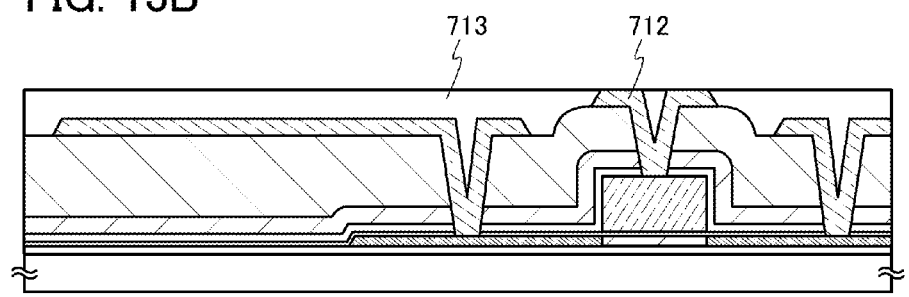

Next, as illustrated in FIG. 13B, the insulating film 713 is subjected to CMP (chemical mechanical polishing) or etching, so that a surface of the conductive film 712 is exposed. Note that in order to improve the characteristics of the transistor 106*t* which is formed later, a surface of the insulating film 713 is preferably planarized as much as possible.

Figure 13C:
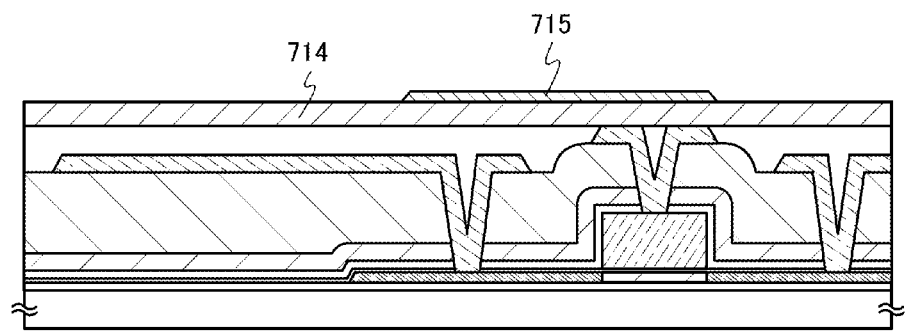

Next, a method for manufacturing the transistor 106*t* is described. First, as illustrated in FIG. 13C, an insulating film 714 is formed over the insulating film 713 and the conductive film 712, and then an oxide semiconductor film 715 is formed over the insulating film 714.

The insulating film 714 can be formed with the use of a material similar to those of the insulating films 707 to 709. In this embodiment, a silicon oxynitride film having a thickness of about 300 nm is used as the insulating film 714.

The oxide semiconductor film 715 can be formed by processing an oxide semiconductor film formed over the insulating film 714 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is formed by a sputtering method using an oxide semiconductor target. The oxide semiconductor film can be formed by a sputtering method in a rare gas (e.g., argon) atmosphere, an oxygen atmosphere, or a mixed atmosphere of a rare gas (e.g., argon) and oxygen.

Note that before the oxide semiconductor film is formed by a sputtering method, dust attached to a surface of the insulating film 714 is preferably removed by reverse sputtering in which an argon gas is introduced and plasma is generated. The reverse sputtering refers to a method in which voltage is applied to a substrate side, but not to a target side, in an argon atmosphere by using an RF power source and plasma is generated in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

In this embodiment, an In—Ga—Zn-based oxide semiconductor thin film with a thickness of 30 nm, which is obtained by a sputtering method using a target including indium (In), gallium (Ga), and zinc (Zn), is used as the oxide semiconductor film. As the above target, it is preferable to use a target having an atomic ratio of In:Ga:Zn=1:1:1, 4:2:3, 3:1:2, 1:1:2, 2:1:3, or 3:1:4. The filling rate of the target including In, Ga, and Zn is higher than or equal to 90% and lower than or equal to 100%, preferably higher than or equal to 95% and lower than 100%. With the use of the target with high filling rate, a dense oxide semiconductor film is formed.

In the case where an In—Zn-based material is used for the oxide semiconductor film, the atomic ratio of metal elements in a target to be used is In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, in a target used for forming an In—Zn-based oxide semiconductor with an atomic ratio of In:Zn:O=X:Y:Z, the relation of Z>1.5X+Y is satisfied. The mobility can be improved by keeping the ratio of Zn within the above range.

In the case of forming an In—Sn—Zn-based oxide semiconductor film as the oxide semiconductor film by a sputtering method, an In—Sn—Zn-based oxide target in which the atomic ratio of metal elements, In, Sn, and Zn is 1:1:1, 2:1:3, 1:2:2, or 4:9:7 is used.

In this embodiment, the oxide semiconductor film is formed in such a manner that the substrate is held in a treatment chamber kept in a reduced pressure state, moisture remaining in the treatment chamber is removed, a sputtering gas from which hydrogen and moisture are removed is introduced, and the target is used. The substrate temperature may be higher than or equal to 100° C. and lower than or equal to 600° C., preferably higher than or equal to 200° C. and lower than or equal to 400° C. in film formation. By formation of the oxide semiconductor film in a state where the substrate is heated, the concentration of impurities included in the formed oxide semiconductor film can be reduced. In addition, damage by sputtering can be reduced. In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film formed in the treatment chamber can be reduced.

One example of the film formation condition is as follows: the distance between the substrate and the target is 100 mm, the pressure is 0.6 Pa, the power of the direct-current (DC) power source is 0.5 kW, and the atmosphere is an oxygen atmosphere (the proportion of the oxygen flow rate is 100%). Note that a pulsed direct-current (DC) power source is preferable because dust generated in film formation can be reduced and the film thickness can be made uniform.

Moreover, when the leakage rate of the treatment chamber of the sputtering apparatus is set lower than or equal to $1 \times 10^{-10}$ Pa·$m^3$/second, entry of impurities such as alkali metal or hydride into the oxide semiconductor film that is being formed by a sputtering method can be reduced. Further, with the use of the entrapment vacuum pump as an evacuation system, counter flow of impurities, such as alkali metal, hydrogen atoms, hydrogen molecules, water, a hydroxyl group, or hydride, from the evacuation system can be reduced.

When the purity of the target is set to 99.99% or higher, alkali metal, hydrogen atoms, hydrogen molecules, water, a hydroxyl group, hydride, or the like mixed into the oxide semiconductor film can be reduced. In addition, when the target is used, the concentration of alkali metal such as lithium, sodium, or potassium can be reduced in the oxide semiconductor film.

In order that hydrogen, a hydroxyl group, and moisture be contained in the oxide semiconductor film as little as possible, it is preferable that an impurity such as hydrogen or moisture that is adsorbed on the substrate 700 be eliminated and exhausted by preheating of the substrate 700, over which films up to the insulating film 714 are formed, in a preheating chamber of the sputtering apparatus, as pretreatment for film formation. The temperature for the preheating is higher than or equal to 100° C. and lower than or equal to 400° C., preferably, higher than or equal to 150° C. and lower than or equal to 300° C. As an evacuation unit, a cryopump is preferably provided in the preheating chamber. Note that this preheating treatment can be omitted. This preheating may be similarly performed on the substrate 700 over which conductive films 717 and 718 are formed before the formation of a gate insulating film 719.

Note that etching for forming the oxide semiconductor film 715 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching, parallel plate reactive ion etching (RIE) or inductively coupled plasma (ICP) etching can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor film 715 may be formed by an inkjet method. Formation of the resist mask by an inkjet method needs no photomask; thus, manufacturing cost can be reduced.

Note that it is preferable that reverse sputtering be performed before the formation of a conductive film in a subsequent step so that a resist residue and the like that attach onto surfaces of the oxide semiconductor film 715 and the insulating film 714 are removed.

Note that the oxide semiconductor film formed by sputtering or the like contains a large amount of moisture or hydrogen (including a hydroxyl group) as an impurity in some cases. Moisture or hydrogen easily forms donor levels and thus serves as an impurity in the oxide semiconductor. In one embodiment of the present invention, in order to reduce impurities such as moisture or hydrogen in the oxide semiconductor film (in order to perform dehydration or dehydrogenation), the oxide semiconductor film 715 is subjected to heat treatment in a reduced-pressure atmosphere, an inert gas atmosphere of nitrogen, a rare gas, or the like, an oxygen gas atmosphere, or ultra-dry air (the moisture amount is 20 ppm (−55° C. by conversion into a dew point) or less, preferably 1 ppm or less, further preferably 10 ppb or less in the case where measurement is performed by a dew point meter in a cavity ring-down laser spectroscopy (CRDS) method).

By performing heat treatment on the oxide semiconductor film 715, moisture or hydrogen in the oxide semiconductor film 715 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is preferably 6N (99.9999%) or higher, further preferably 7N (99.99999%) or higher (that is, the impurity concentration is preferably 1 ppm or lower, further preferably 0.1 ppm or lower).

Through the above process, the concentration of hydrogen in the oxide semiconductor film 715 can be reduced and the oxide semiconductor film 715 can be highly purified. Thus, the oxide semiconductor film can be stabilized. In addition, heat treatment at a temperature lower than or equal to the glass transition temperature makes it possible to form an oxide semiconductor film with extremely low carrier density and a wide bandgap. Thus, the transistor can be formed using a large substrate, so that mass productivity can be improved. In addition, by using the oxide semiconductor film in which the hydrogen concentration is reduced and the purity is improved, it is possible to manufacture a transistor with high withstand voltage and an extremely small off-state current. The above heat treatment can be performed at any time after the oxide semiconductor film is formed.

Note that the oxide semiconductor film may be either amorphous or crystalline. As a crystalline oxide semiconductor film, an oxide semiconductor film (c-axis aligned crystalline oxide semiconductor film (CAAC-OS film)) including crystals with c-axis orientation (CAAC) is also preferable because the effect of improving the reliability of a transistor can be obtained.

Sputtering may be performed to form an oxide semiconductor film including a CAAC-OS film. In order to obtain a CAAC-OS film by sputtering, it is important to form hexagonal crystals in an initial stage of deposition of an oxide semiconductor film and to cause crystal growth from the hexagonal crystals as seed crystals. In order to achieve this, it is preferable that the distance between the target and the substrate be made longer (e.g., 150 mm to 200 mm) and the substrate heating temperature be 100° C. to 500° C., more preferably 200° C. to 400° C., still preferably 250° C. to 300° C. In addition to this, the deposited oxide semiconductor film is subjected to heat treatment at a temperature higher than the substrate heating temperature in the deposition. Thus, microdefects in the film and defects at the interface between stacked layers can be repaired.

Figure 14A:
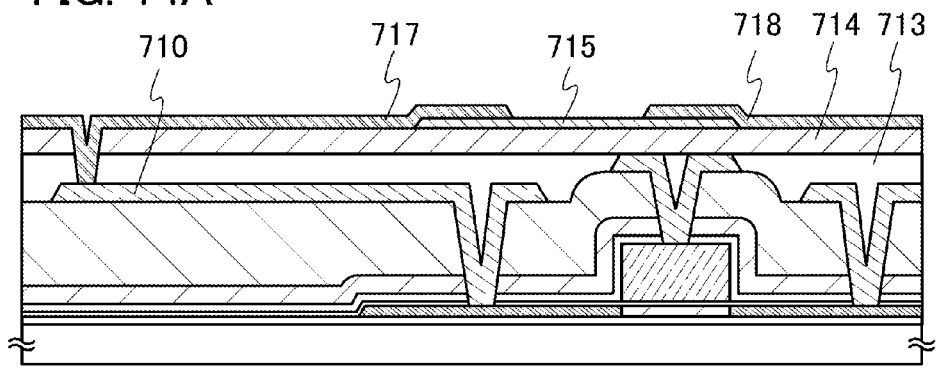
FIGS. 14A to 14C illustrate a method for manufacturing a PLD.

Next as illustrated in FIG. 14A, part of the conductive film 710 is exposed by formation of an opening by etching or the like in the insulating film 713 and the insulating film 714, and then the conductive film 717 in contact with the conductive film 710 in the opening and also in contact with the oxide semiconductor film 715 and the conductive film 718 in contact with the oxide semiconductor film 715 are formed. The conductive films 717 and 718 function as a source and drain electrodes.

Specifically, the conductive films 717 and 718 can be formed as follows: a conductive film is formed over the insulating film 714 by sputtering or vacuum evaporation so as to cover the opening, and then, the conductive film is processed (patterned) into a predetermined shape.

The conductive film which is to be the conductive films 717 and 718 can be formed using any of the following materials: an element selected from aluminum, chromium, copper, tantalum, titanium, molybdenum, and tungsten; an alloy containing any of these elements as a component; an alloy film containing any of these elements in combination; and the like. Alternatively, the conductive film may have a structure in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which is to be the conductive films 717 and 718 may have a single-layer structure or a stacked-layer structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesiveness with an oxide film. Therefore, for the conductive films 717 and 718, a layered structure is employed in which a conductive film containing a Cu—Mg—Al alloy, a Mo—Ti alloy, Ti, or Mo is used for the lower layer and a conductive film containing Cu is used for the upper layer; thus, the adhesiveness between the insulating film 714, which is an oxide film, and the conductive films 717 and 718 can be increased.

For the conductive film which is to be the conductive films 717 and 718, a conductive metal oxide may be used. As the conductive metal oxide, indium oxide, tin oxide, zinc oxide, a mixture of indium oxide and tin oxide, a mixture of indium oxide and zinc oxide, or the conductive metal oxide material to which silicon or silicon oxide is added can be used.

In the case where heat treatment is performed after formation of the conductive film, the conductive film preferably has heat resistance enough to withstand the heat treatment.

In this embodiment, each of the conductive films 717 and 718 is a 150-nm-thick tungsten film.

Note that materials and etching conditions are adjusted as appropriate so that the oxide semiconductor film 715 is removed as little as possible in etching of the conductive film. Depending on the etching conditions, an exposed portion of the oxide semiconductor film 715 is partly etched, so that a groove (a depression portion) is formed in some cases.

In this embodiment, a tungsten film is used as the conductive film which is to be the conductive films 717 and 718. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing carbon tetrafluoride ($CF_4$), chlorine ($Cl_2$), or oxygen.

In order to reduce the number of photomasks and steps in a photolithography process, etching may be performed with the use of a resist mask formed using a multi-tone mask through which light is transmitted so as to have a plurality of intensities. A resist mask formed using a multi-tone mask has a plurality of thicknesses and can be changed in shape by etching; thus, the resist mask can be used in a plurality of etching steps for processing films into different patterns. Therefore, a resist mask corresponding to at least two kinds of different patterns can be formed by one multi-tone mask. Thus, the number of light-exposure masks can be reduced and the number of corresponding photolithography steps can be also reduced, whereby simplification of a process can be achieved.

Further, an oxide conductive film functioning as a source region and a drain region may be provided between the oxide semiconductor film 715 and the conductive films 717 and 718 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the conductive films 717 and 718 may be performed concurrently.

With provision of the oxide conductive film functioning as a source region and a drain region, resistance between the oxide semiconductor film 715 and the conductive films 717 and 718 can be lowered, so that the transistor can operate at high speed. In addition, with provision of the oxide conductive film functioning as a source region and a drain region, the withstand voltage of the transistor can be increased.

Next, plasma treatment may be performed using a gas such as $N_2O$, $N_2$, or Ar. By this plasma treatment, water or the like adhering to an exposed surface of the oxide semiconductor film is removed. Plasma treatment may be performed using a mixture gas of oxygen and argon as well.

Figure 14B:
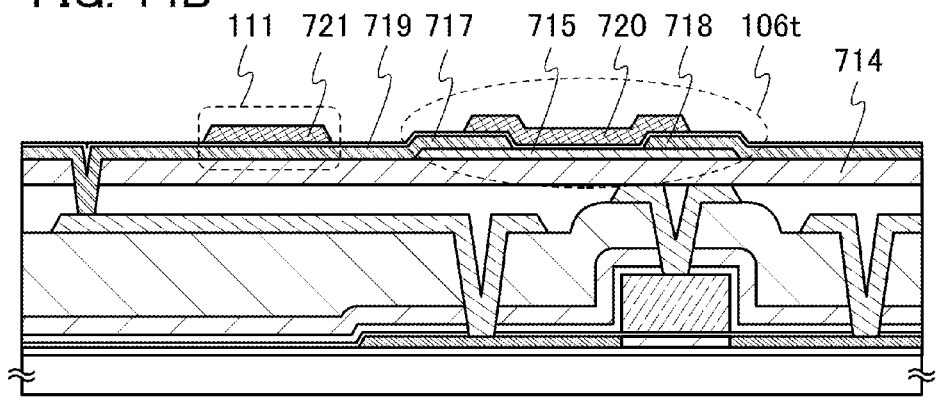

After the plasma treatment, as illustrated in FIG. 14B, the gate insulating film 719 is formed so as to cover the conductive films 717 and 718 and the oxide semiconductor film 715. Then, a gate electrode 720 is formed over the gate insulating film 719 so as to overlap with the oxide semiconductor film 715, and a conductive film 721 is formed over the conductive film 719 so as to overlap with the conductive film 717.

The gate insulating film 719 can be formed using a material and a layered structure which are similar to those of the gate insulating film 703. Note that the gate insulating film 719 preferably contains impurities such as moisture or hydrogen as little as possible, and the gate insulating film 719 may be formed using a single-layer insulating film or a plurality of insulating films stacked. When hydrogen is contained in the gate insulating film 719, hydrogen enters the oxide semiconductor film 715 or oxygen in the oxide semiconductor film 715 is extracted by hydrogen, whereby the oxide semiconductor film 715 has lower resistance (n-type conductivity); thus, a parasitic channel might be formed. Thus, it is important that a deposition method in which hydrogen is not used be employed in order to form the gate insulating film 719 containing hydrogen as little as possible. A material having a high barrier property is preferably used for the gate insulating film 719. As the insulating film having a high barrier property, a silicon nitride film, a silicon nitride oxide film, an aluminum nitride film, an aluminum nitride oxide film, or the like can be used, for example. When a stack of a plurality of insulating films is used, an insulating film having low proportion of nitrogen such as a silicon oxide film or a silicon oxynitride film is formed on a side which is closer to the oxide semiconductor film 715 than the insulating film having a high barrier property. Then, the insulating film having a high barrier property is formed so as to overlap with the conductive films 717 and 718 and the oxide semiconductor film 715 with the insulating film having low proportion of nitrogen sandwiched therebetween. When the insulating film having a high barrier property is used, impurities such as moisture or hydrogen can be prevented from entering the oxide semiconductor film 715, the gate insulating film 719, or the interface between the oxide semiconductor film 715 and another insulating film and the vicinity thereof. In addition, the insulating film having lower proportion of nitrogen, such as a silicon oxide film or a silicon oxynitride film, is formed so as to be in contact with the oxide semiconductor film 715, so that the insulating film having a high barrier property can be prevented from being in direct contact with the oxide semiconductor film 715.

In this embodiment, a silicon oxynitride film with a thickness of 30 nm which is formed by a sputtering method is used as the gate insulating film 719. The substrate temperature at deposition may be higher than or equal to room temperature and lower than or equal to 400° C., and in this embodiment is 300° C.

After the gate insulating film 719 is formed, heat treatment may be performed. The heat treatment is performed in a nitrogen atmosphere, ultra-dry air, or a rare gas (such as argon or helium) atmosphere preferably at a temperature higher than or equal to 200° C. and lower than or equal to 400° C., for example, higher than or equal to 250° C. and lower than or equal to 350° C. It is preferable that the water content in the gas be 20 ppm or less, preferably 1 ppm or less, further preferably 10 ppb or less. In this embodiment, for example, heat treatment is performed at 250° C. for one hour in a nitrogen atmosphere. Alternatively, RTA treatment for a short time at a high temperature may be performed before the formation of the conductive films 717 and 718 in a manner similar to that of the heat treatment performed on the oxide semiconductor film for reduction of moisture or hydrogen. Even when oxygen vacancies are generated in the oxide semiconductor film 715 by the heat treatment performed on the oxide semiconductor film 715, oxygen is supplied to the oxide semiconductor film 715 from the gate insulating film 719 by performing heat treatment after provision of the gate insulating film 719 containing oxygen. By the supply of oxygen to the oxide semiconductor film 715, oxygen vacancies that serve as donors can be reduced in the oxide semiconductor film 715 and the stoichiometric composition can be satisfied. It is preferable that the proportion of oxygen in the oxide semiconductor film is higher than that in the stoichiometric composition. As a result, the oxide semiconductor film 715 can be made substantially i-type and variations in electric characteristics of transistors due to oxygen vacancies can be reduced; thus, electric characteristics can be improved. There is no particular limitation on the timing of this heat treatment as long as it is after the formation of the gate insulating film 719. When this heat treatment also serves as heat treatment in another step (e.g., heat treatment at the time of formation of a resin film or heat treatment for lowering the resistance of a transparent conductive film), the oxide semiconductor film 715 can be made substantially i-type without an increase in the number of steps.

Further, oxygen vacancies that serve as donors in the oxide semiconductor film 715 may be reduced by performing heat treatment on the oxide semiconductor film 715 in an oxygen atmosphere so that oxygen is added to the oxide semiconductor. The heat treatment is performed at, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. The purity of the oxygen gas which is introduced into a heat treatment apparatus is preferably 6N (99.9999%) or higher, further preferably 7N (99.99999%) or higher (i.e., the impurity concentration in the oxygen is preferably 1 ppm or lower, further preferably 0.1 ppm or lower).

Alternatively, oxygen may be added to the oxide semiconductor film 715 by an ion implantation method, an ion doping method, or the like so that oxygen vacancies that serve as donors are reduced. For example, oxygen made to be plasma with a microwave of 2.45 GHz may be added to the oxide semiconductor film 715.

The gate electrode 720 and the conductive film 721 can be formed in such a manner that a conductive film is formed over the gate insulating film 719 and then is patterned. The gate electrode 720 and the conductive film 721 can be formed using a material similar to that of the gate electrode 704 or the conductive films 717 and 718.

The thickness of each of the gate electrode 720 and the conductive film 721 is 10 nm to 400 nm, preferably 100 nm to 300 nm. In this embodiment, after a conductive film with a thickness of 150 nm for the gate electrode is formed by a sputtering method using a tungsten target, the conductive film is processed (patterned) into a desired shape by etching, whereby the gate electrode 720 and the conductive film 721 are formed. Note that a resist mask may be formed by an inkjet method. Formation of the resist mask by an inkjet method needs no photomask; thus, manufacturing cost can be reduced.

Through the above steps, the transistor 106*t* is formed.

Note that a portion where the conductive film 717 and the conductive film 721 overlap with each other with the gate insulating film 719 provided therebetween corresponds to the capacitor 111. Although the capacitor 112 is not illustrated in this embodiment, similarly to the capacitor 111, the capacitor 112 can be formed by providing, besides the conductive film 721, a conductive film which overlaps with the conductive film 717 with the gate insulating film 719 provided therebetween over the gate insulating film 719.

Although the transistor 106*t* is described as a single-gate transistor, a multi-gate transistor including a plurality of channel formation regions can be formed when a plurality of gate electrodes which are electrically connected to each other are included, if needed.

Note that an insulating film which is in contact with the oxide semiconductor film 715 (in this embodiment, corresponding to the insulating film 714 and the gate insulating film 719) may be formed using an insulating material containing an element that belongs to Group 13 and oxygen. Many of oxide semiconductor materials contain Group 13 elements, and an insulating material containing a Group 13 element works well with oxide semiconductors. By using such an insulating material containing a Group 13 element for the insulating film in contact with the oxide semiconductor film, the state of an interface with the oxide semiconductor film can be kept well.

An insulating material containing a Group 13 element is an insulating material containing one or more Group 13 elements. Examples of the insulating material containing a Group 13 element include gallium oxide, aluminum oxide, aluminum gallium oxide, and gallium aluminum oxide. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case where an insulating film is formed in contact with an oxide semiconductor film containing gallium, when a material containing gallium oxide is used for the insulating film, favorable characteristics can be kept at the interface between the oxide semiconductor film and the insulating film. For example, when the oxide semiconductor film and the insulating film containing gallium oxide are provided in contact with each other, pileup of hydrogen at the interface between the oxide semiconductor film and the insulating film can be reduced. Note that a similar effect can be obtained in the case where an element in the same group as a constituent element of the oxide semiconductor is used in an insulating film. For example, it is effective to form an insulating film with the use of a material containing aluminum oxide. Note that aluminum oxide has a property of not easily transmitting water. Thus, it is preferable to use a material including aluminum oxide in terms of preventing entry of water to the oxide semiconductor film.

The insulating film in contact with the oxide semiconductor film 715 preferably contains oxygen in a proportion higher than that in the stoichiometric composition by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

By oxygen doping, an insulating film that includes a region where the proportion of oxygen is higher than that in the stoichiometric composition can be formed. When the insulating film including such a region is in contact with the oxide semiconductor film, excess oxygen in the insulating film is supplied to the oxide semiconductor film, and oxygen vacancies in the oxide semiconductor film or at the interface between the oxide semiconductor film and the insulating film are reduced. Thus, the oxide semiconductor film can be an i-type or substantially i-type oxide semiconductor.

The insulating film including a region where the proportion of oxygen is higher than that in the stoichiometric composition may be applied to either the insulating film placed on an upper side of the oxide semiconductor film or the insulating film placed on a lower side of the oxide semiconductor film of the insulating films which are in contact with the oxide semiconductor film 715; however, it is preferable to apply such an insulating film to both the insulating films which are in contact with the oxide semiconductor film 715. The above effect can be enhanced with a structure where the oxide semiconductor film 715 is sandwiched between the insulating films each including a region where the proportion of oxygen is higher than that in the stoichiometric composition, which are used as the insulating films in contact with the oxide semiconductor film 715 and positioned on the upper side and the lower side of the oxide semiconductor film 715.

The insulating films on the upper side and the lower side of the oxide semiconductor film 715 may contain the same constituent element or different constituent elements. The insulating film in contact with the oxide semiconductor film 715 may be a stack of insulating films each of which includes a region where the proportion of oxygen is higher than that in the stoichiometric composition.

Figure 14C:
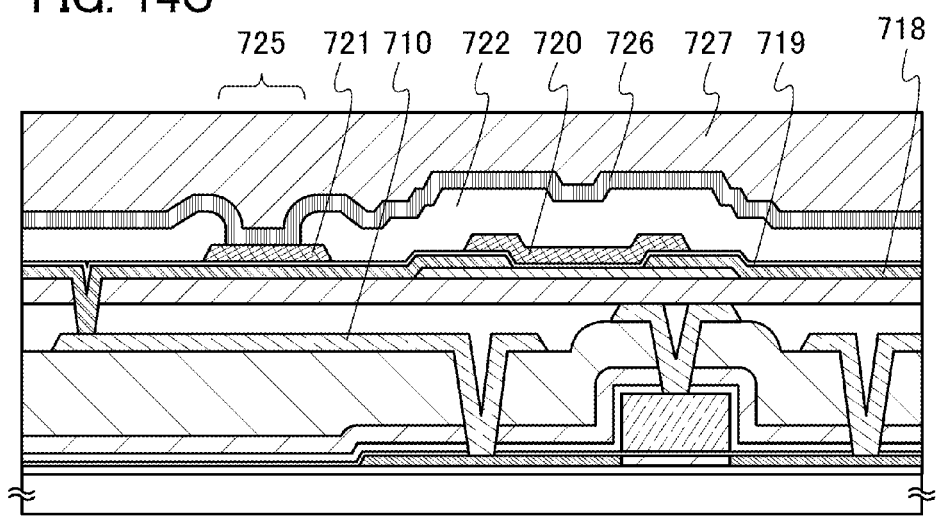

Next, as illustrated in FIG. 14C, an insulating film 722 is formed so as to cover the gate insulating film 719, the conductive film 721, and the gate electrode 720. The insulating film 722 can be formed by PVD, CVD, or the like. The insulating film 722 can be formed using a material including an inorganic insulating material such as silicon oxide, silicon oxynitride, silicon nitride, hafnium oxide, gallium oxide, or aluminum oxide. Note that for the insulating film 722, a material with a low dielectric constant or a structure with a low dielectric constant (e.g., a porous structure) is preferably used. When the dielectric constant of the insulating film 722 is lowered, parasitic capacitance generated between wirings or electrodes can be reduced, which results in higher speed operation. Although the insulating film 722 has a single-layer structure in this embodiment, one embodiment of the present invention is not limited to this structure. The insulating film 722 may have a stacked-layer structure of two or more layers.

Next, an opening 725 is formed in the gate insulating film 719 and the insulating film 722, so that part of the conductive film 721 is exposed. After that, a wiring 726 which is in contact with the conductive film 721 through the opening 725 is formed over the insulating film 722.

A conductive film is formed by PVD or CVD and then is patterned, so that the wiring 726 is formed. As a material of the conductive film, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

In this embodiment, a conductive film formed by stacking a titanium film with a thickness of about 50 nm, an aluminum film with a thickness of about 200 nm, and a titanium film with a thickness of about 50 nm in this order by a sputtering method is used as the wiring 726. Here, the titanium film has a function of reducing an oxide film (e.g., a native oxide film) formed on the surface over which the titanium film is formed, to decrease the contact resistance with the lower electrode or the like (here, the conductive film 718). In addition, hillock of the aluminum film can be prevented. A copper film may be formed by a plating method after a barrier film of titanium, titanium nitride, or the like is formed.

Next, an insulating film 727 is formed so as to cover the wiring 726. Through the series of steps, the PLD can be manufactured.

Note that in the manufacturing method, the conductive films 717 and 718 functioning as source and drain electrodes are formed after the formation of the oxide semiconductor film 715. Thus, as illustrated in FIG. 14B, in the transistor 106t obtained by the manufacturing method, the conductive films 717 and 718 are formed over the oxide semiconductor film 715. However, in the transistor 106t, the conductive films functioning as source and drain electrodes may be formed below the oxide semiconductor film 715, that is, between the oxide semiconductor film 715 and the insulating film 714.

Figure 15:
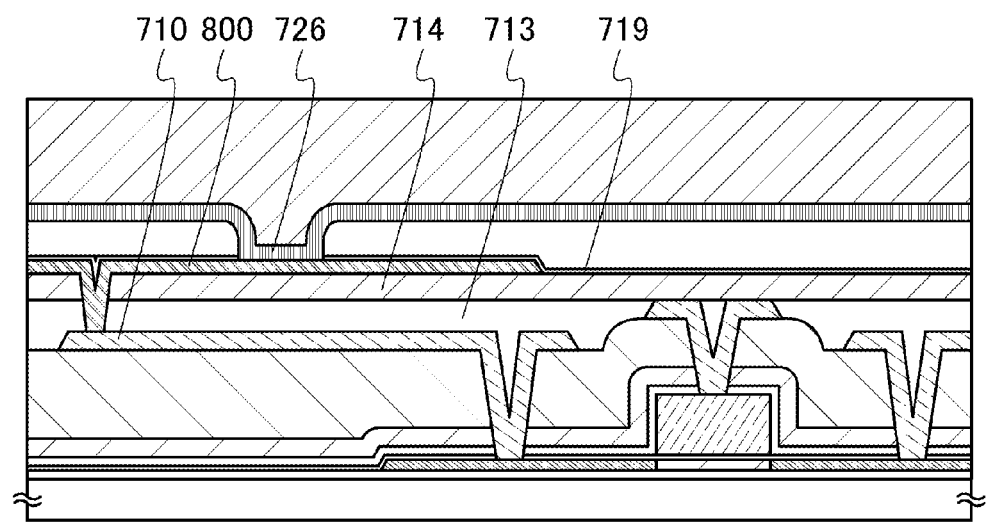
FIG. 15 is a cross-sectional view of a semiconductor device.

In FIG. 14C, the conductive film 710 and the conductive film 717 correspond to the node 110 in FIG. 6A. In addition, the conductive film 721 corresponds to the wiring 108 in FIG. 6A. Next, a cross-sectional view of a semiconductor device manufactured based on the above PLD is illustrated in FIG. 15. In the semiconductor device in FIG. 15, layers up to the insulating film 714 can have the same structure as those in the PLD. An opening is formed in the insulating films 713 and 714, and a wiring 800 connected to the conductive film 710 through the opening is provided over the insulating film 714. The wiring 800 is preferably formed using a material and a layered structure similar to those of the conductive film 718. In addition, the layout of the wiring 800 is preferably similar to the layout of the conductive film 718. When the wiring 800 has such a structure, parasitic capacitance between the wiring 800 and the programmable logic element in the semiconductor device can be close to the parasitic capacitance between the memory array and the programmable logic element in the PLD. Consequently, power consumption of the semiconductor device can be estimated accurately at the stage of testing the PLD.

This embodiment can be implemented in appropriate combination with any of the other embodiments.

Embodiment 5

In this embodiment, examples of the layout of the memory elements 103 and examples of the layout in which the memory elements 103 are each replaced with wirings are described.

Figure 17A:
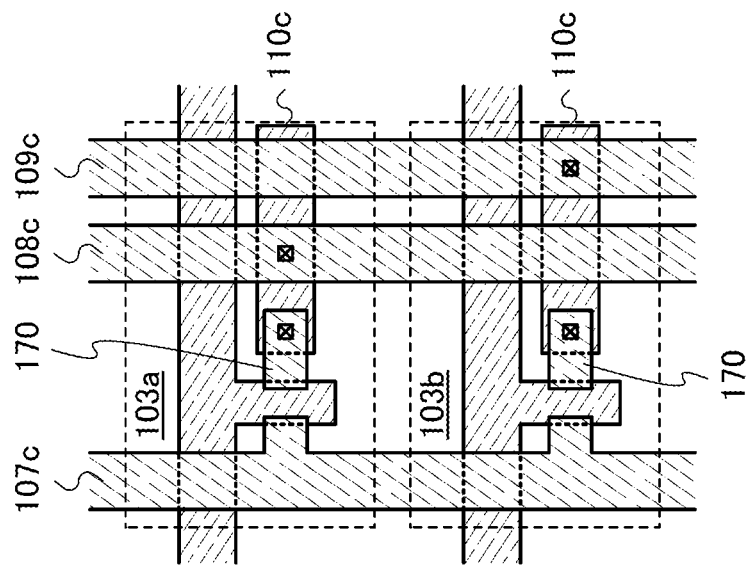
FIGS. 17A and 17B illustrate the layout of memory elements and the layout of conductive films.

FIG. 17A illustrates an example of the layout of the memory elements 103a and 103b in FIG. 6A. The memory elements 103a and 103b in FIG. 17A include a conductive film 107c functioning as the wiring 107, a conductive film 108c functioning as the wiring 108, a conductive film 109c functioning as the wiring 109, and a conductive film 150c functioning as the wiring 150. The conductive film 107c also functions as one of the source terminal and the drain terminal of the transistor 106t. The conductive film 150c also functions as the gate electrode of the transistor 106t.

The memory elements 103a and 103b include a conductive film 170 and a conductive film 110c connected to the conductive film 170. The conductive film 170 functions as the other of the source terminal and the drain terminal of the transistor 106t.

The conductive film 110c functions as part of the node 110. Although not illustrated, the conductive film 110c is electrically connected to the programmable logic element provided below the memory elements 103a and 103b. Note that in one embodiment of the present invention, the node 110 has a function of establishing electrical connection between the memory array and the programmable logic element; accordingly, it can be said that one or more conductive films functioning as the node 110 are included in either or both the memory array and the programmable logic element.

A region where the conductive film 108c and the conductive film 110c overlap with each other with the gate insulating film (not shown) therebetween functions as the capacitor 111. A region where the conductive film 109c and the conductive film 110c overlap with each other with the gate insulating film (not shown) therebetween functions as the capacitor 112.

Figure 17B:
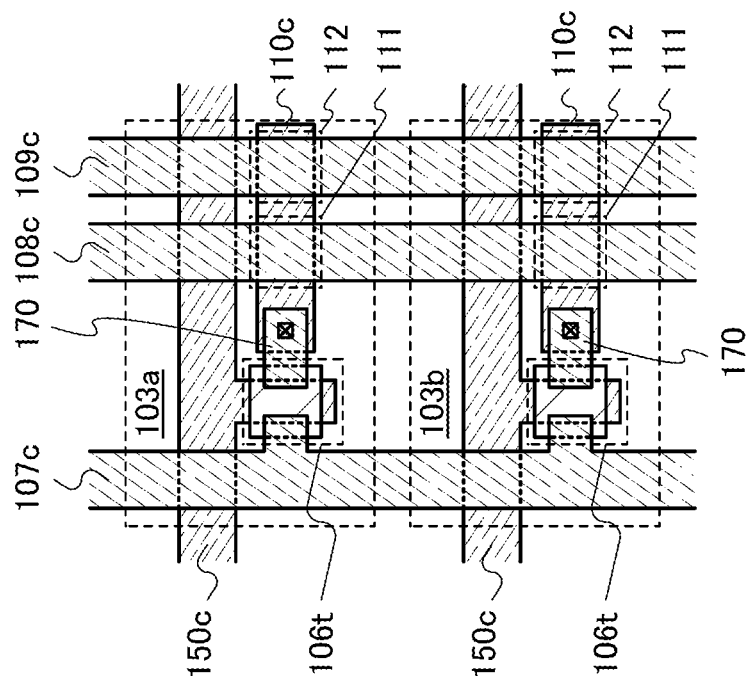

FIG. 17B illustrates an example of the layout in the case where the memory elements 103a and 103b in FIG. 17A are each replaced with the conductive film 110c, the conductive film 108c, and the conductive film 109c.

In the case exemplified in FIG. 17B, the conductive film 108c is selected from the conductive films 108c and 109c, which are provided instead of the memory element 103a, by the configuration data to be connected to the conductive film 110c. Further, the conductive film 109c is selected from the conductive films 108c and 109c, which are provided instead of the memory element 103b, by the configuration data to be connected to the conductive film 110c.

FIG. 17B illustrates the case where the conductive film 107c and the conductive film 170 are provided as well as the conductive film 110c, the conductive film 108c, and the conductive film 109c instead of the memory element 103a; however, the conductive film 107c and the conductive film 170 are not necessarily provided in the semiconductor device. Note that when the conductive film 107c and the conductive film 170 are provided in the semiconductor device as in the PLD, power consumption or operation frequency of the semiconductor device due to parasitic capacitance can be estimated more accurately at the stage of testing the PLD.

FIGS. 17A and 17B illustrate the case where the transistor 106t is a bottom-gate transistor. Accordingly, in FIG. 17A, the conductive film 150c and the conductive film 110c are formed in a first layer, and the conductive film 107c, the conductive film 108c, the conductive film 109c, and the conductive film 170 are formed in a second layer above the first layer.

Figure 18A:
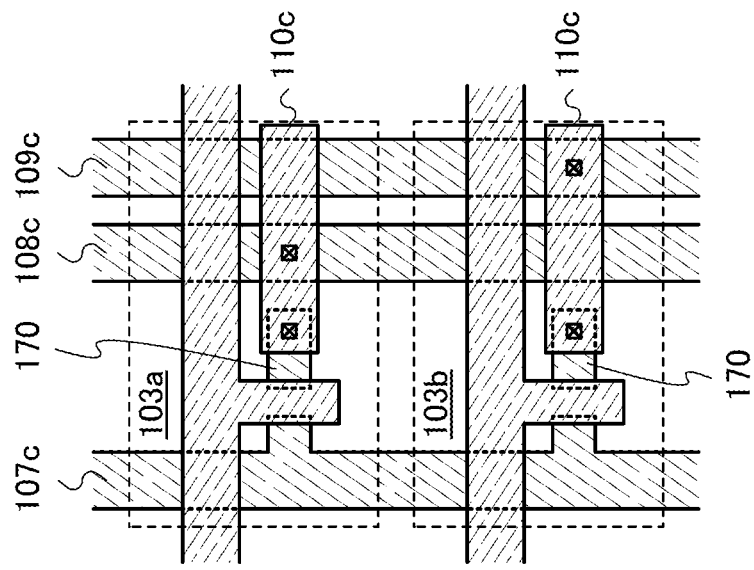
FIGS. 18A and 18B illustrate the layout of memory elements and the layout of conductive films.
Figure 18B:
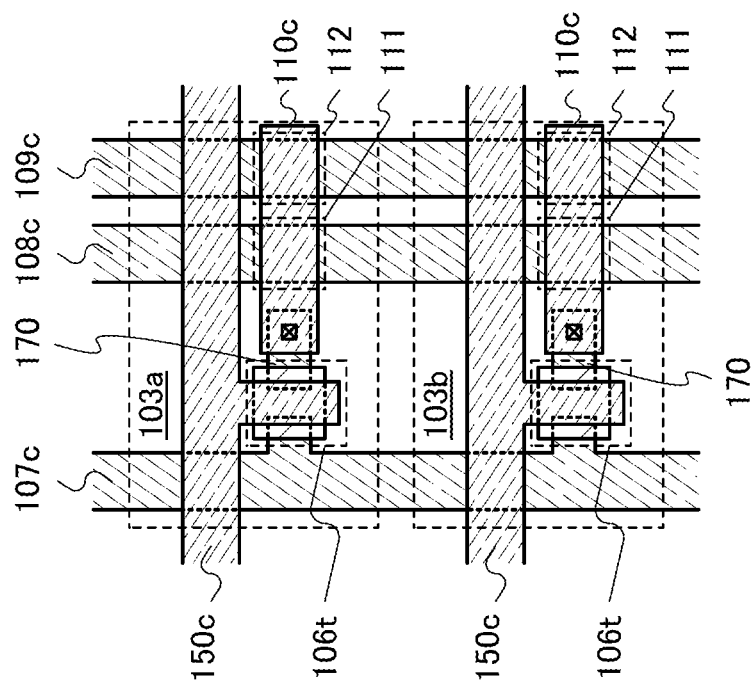

FIGS. 18A and 18B illustrate the layout of the memory elements 103a and 103b and the layout in the case where the memory elements 103a and 103b are each replaced with wirings, as examples in the case where the transistor 106t is a top-gate transistor. In FIGS. 18A and 18B, the conductive film 107c, the conductive film 108c, the conductive film 109c, and the conductive film 170 are formed in a first layer, and the conductive film 150c and the conductive film 110c are formed in a second layer above the first layer.

Figure 19A:
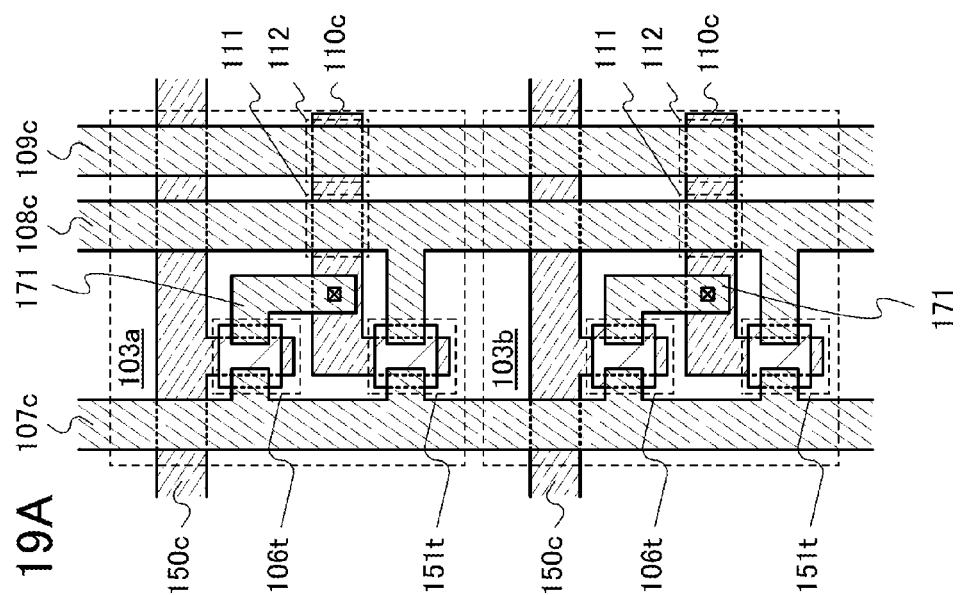
FIGS. 19A and 19B illustrate the layout of memory elements and the layout of conductive films.

FIG. 19A illustrates an example of the layout of the memory elements 103a and 103b in FIG. 7A. The memory elements 103a and 103b in FIG. 19A include the conductive film 107c functioning as the wiring 107, the conductive film 108c functioning as the wiring 108, the conductive film 109c functioning as the wiring 109, and the conductive film 150c functioning as the wiring 150. The conductive film 107c functions as one of the source terminal and the drain terminal of the transistor 106t and also functions as one of the source terminal and the drain terminal of the transistor 151t. The conductive film 108c also functions as the other of the source terminal and the drain terminal of the transistor 151t. The conductive film 150c also functions as the gate electrode of the transistor 106t.

The memory elements 103a and 103b include a conductive film 171 and the conductive film 110c connected to the conductive film 171. The conductive film 171 functions as the other of the source terminal and the drain terminal of the transistor 106t. The conductive film 110c functions as the gate electrode of the transistor 151t.

The conductive film 110c also functions as part of the node 110. Although not illustrated, the conductive film 110c is electrically connected to the programmable logic element provided below the memory elements 103a and 103b.

A region where the conductive film 108c and the conductive film 110c overlap with each other with the gate insulating film (not shown) therebetween functions as the capacitor 111. A region where the conductive film 109c and the conductive film 110c overlap with each other with the gate insulating film (not shown) therebetween functions as the capacitor 112.

Figure 19B:
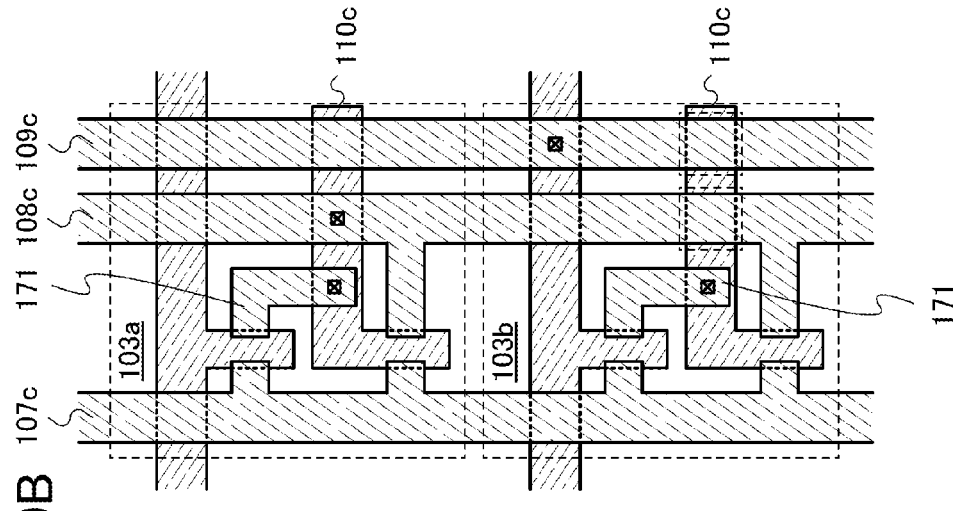

FIG. 19B illustrates an example of the layout in the case where the memory elements 103a and 103b in FIG. 19A are each replaced with the conductive film 110c, the conductive film 108c, and the conductive film 109c.

In the case exemplified in FIG. 19B, the conductive film 108c is selected from the conductive films 108c and 109c, which are provided instead of the memory element 103a, by the configuration data to be connected to the conductive film 110c. Further, the conductive film 109c is selected from the conductive films 108c and 109c, which are provided instead of the memory element 103b, by the configuration data to be connected to the conductive film 110c.

FIG. 19B illustrates the case where the conductive film 107c and the conductive film 171 are provided as well as the conductive film 110c, the conductive film 108c, and the conductive film 109c instead of the memory element 103a; however, the conductive film 107c and the conductive film 171 are not necessarily provided in the semiconductor device. Note that when the conductive film 107c and the conductive film 171 are provided in the semiconductor device as in the PLD, power consumption or operation frequency of the semiconductor device due to parasitic capacitance can be estimated more accurately at the stage of testing the PLD.

FIGS. 19A and 19B illustrate the case where the transistor 106t and the transistor 151t are bottom-gate transistors. Accordingly, in FIG. 19A, the conductive film 150c and the conductive film 110c are formed in a first layer, and the conductive film 107c, the conductive film 108c, the conductive film 109c, and the conductive film 171 are formed in a second layer above the first layer.

Figure 20A:
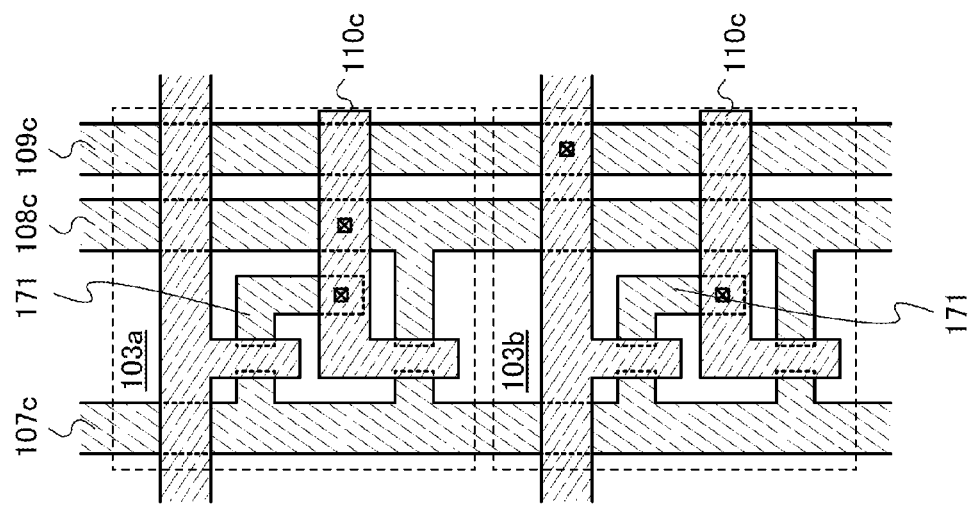
FIGS. 20A and 20B illustrate the layout of memory elements and the layout of conductive films.
Figure 20B:
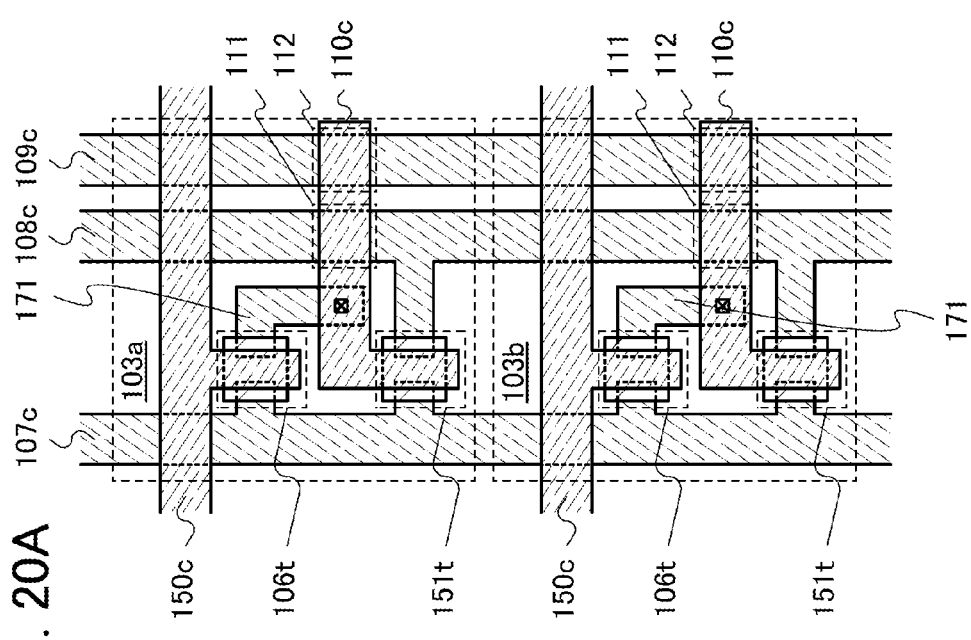

FIGS. 20A and 20B illustrate the layout of the memory elements 103a and 103b and the layout in the case where the memory elements 103a and 103b are each replaced with wirings, as examples in the case where the transistor 106t and the transistor 151t are top-gate transistors. In FIGS. 20A and 20B, the conductive film 107c, the conductive film 108c, the conductive film 109c, and the conductive film 171 are formed in a first layer, and the conductive film 150c and the conductive film 110c are formed in a second layer above the first layer.

This embodiment can be implemented in appropriate combination with any of the other embodiments.

Embodiment 6

The semiconductor device or the programmable logic device according to one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can include the semiconductor device or the programmable logic device according to one embodiment of the present invention are mobile phones, game machines including portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 16A to 16F illustrate specific examples of these electronic devices.

Figure 16A:
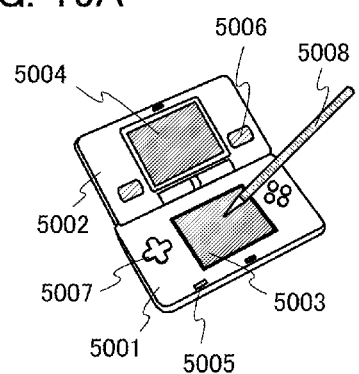
FIGS. 16A to 16F each illustrate an electronic device.

FIG. 16A illustrates a portable game machine, which includes a housing 5001, a housing 5002, a display portion 5003, a display portion 5004, a microphone 5005, speakers 5006, an operation key 5007, a stylus 5008, and the like. Note that although the portable game machine in FIG. 16A includes the two display portions 5003 and 5004, the number of display portions included in the portable game machine is not limited to two.

Figure 16B:
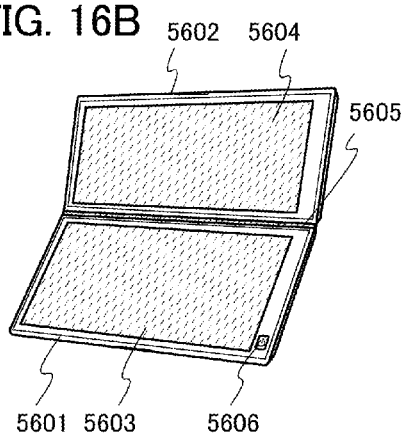

FIG. 16B illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel area of a display device.

Figure 16C:
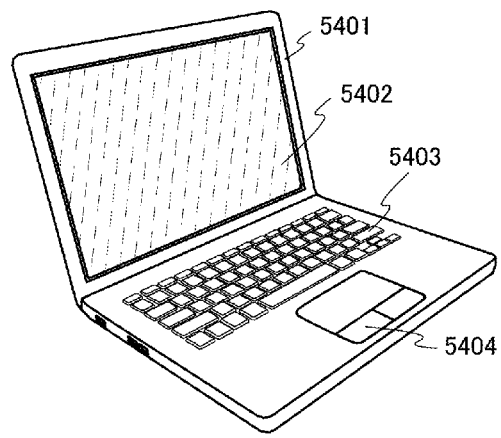

FIG. 16C illustrates a laptop personal computer, which includes a housing 5401, a display portion 5402, a keyboard 5403, a pointing device 5404, and the like.

Figure 16D:
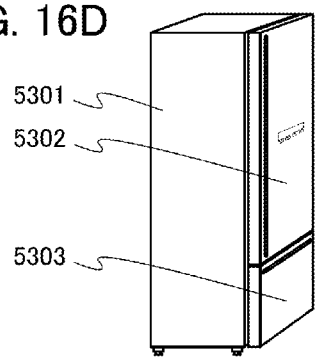

FIG. 16D illustrates an electric refrigerator-freezer, which includes a housing 5301, a door for a refrigerator 5302, a door for a freezer 5303, and the like.

Figure 16E:
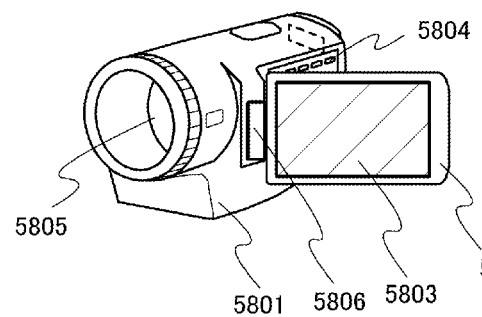

FIG. 16E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806.

Figure 16F:
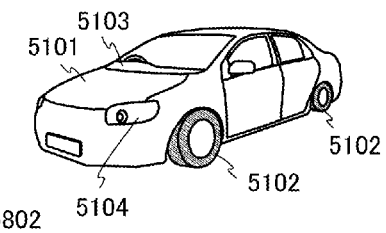

FIG. 16F illustrates an ordinary motor vehicle, which includes a car body 5101, wheels 5102, a dashboard 5103, lights 5104, and the like.

This embodiment can be combined with any of the other embodiments as appropriate.

This application is based on Japanese Patent Application serial no. 2012-026105 filed with Japan Patent Office on Feb. 9, 2012, the entire contents of which are hereby incorporated by reference.

What is claimed is:

1. A method for manufacturing a first semiconductor device comprising a first programmable logic element comprising a first transistor, a first electrode, a first insulating film, a first wiring, a second wiring, and a contact corresponding to first configuration data determined by using a second semiconductor device manufactured by the steps of:
   forming a second programmable logic element corresponding to the first programmable logic element, the second programmable logic element comprising:
      a second transistor corresponding to the first transistor; and
   forming a second memory element over the second programmable logic element, the second memory element comprising:
      a second electrode corresponding to the first electrode over the second transistor, the second electrode being electrically connected to a gate of the second transistor;
      a third transistor over the second transistor, the third transistor comprising a first terminal and a second terminal, the second terminal of the third transistor being electrically connected to the second electrode;
      a first capacitor comprising the second electrode, a second insulating film corresponding to the first insulating film over the second electrode, and a third wiring corresponding to the first wiring over the second insulating film and overlapping with the second electrode; and
      a second capacitor comprising the second electrode, the second insulating film, and a fourth wiring corresponding to the second wiring over the second insulating film and overlapping with the second electrode,
   wherein the method comprises the steps of:
      forming the first programmable logic element comprising the first transistor;
      forming the first electrode over the first transistor;
      forming the first insulating film over the first electrode over the first electrode;
      forming the contact in the first insulating film;
      forming the first wiring and the second wiring over the first insulating film and overlapping with the first electrode to electrically connect the first electrode to one of the first wiring and the second wiring through the contact,
   wherein the first programmable logic element is configured to execute a same operation as the second programmable logic element programmed with the first configuration data.

2. The method for manufacturing the first semiconductor device according to claim 1, wherein the first wiring is configured to supply a first voltage, and wherein the second wiring is configured to supply a second voltage.

3. The method for manufacturing the first semiconductor device according to claim 1, wherein the first configuration data is determined by the steps of:

supplying a first gate signal to a gate of the third transistor to turn on the third transistor;

supplying a data signal corresponding to second configuration data to the first terminal of the third transistor;

storing a first charge corresponding to the second configuration data to the first capacitor;

storing a second charge corresponding to the second configuration data to the second capacitor, supplying a second gate signal to the gate of the third transistor to turn off the third transistor;

supplying a voltage corresponding to the second configuration data to the second programmable logic element from the second electrode;

performing an operation of the second programmable logic element determined by the second configuration data; and determining the second configuration data as the first configuration data when the second programmable logic element performs a desired operation.

4. The method for manufacturing the first semiconductor device according to claim 3, wherein the first wiring is configured to supply a first voltage, and wherein the second wiring is configured to supply a second voltage.

5. The method for manufacturing the first semiconductor device according to claim 3, wherein off-state current of the third transistor is smaller than about 40 fA when a drain voltage is 3.3 V.

6. The method for manufacturing the first semiconductor device according to claim 3, wherein the third transistor comprises an oxide semiconductor in a channel formation region.

7. A method for manufacturing a first semiconductor device, comprising the steps of:

forming a first programmable logic element comprising a first transistor;

forming a first memory element over the first programmable logic element by the steps of:

forming a first electrode over the first transistor and electrically connected to a gate of the first transistor;

forming a second transistor over the first transistor and comprising a first terminal and a second terminal, the second terminal of the second transistor being electrically connected to the first electrode;

forming a first insulating film over the first electrode;

forming a first wiring over the first insulating film and overlapping with the first electrode to form a first capacitor between the first electrode and the first wiring; and forming a second wiring over the first insulating film and overlapping with the first electrode to form a second capacitance between the first electrode and the second wiring, wherein a second semiconductor device is capable to be manufactured by the steps of:

forming a second programmable logic element corresponding to the first programmable logic element, the second programmable logic element comprising:

a third transistor corresponding to the first transistor;

forming a second electrode corresponding to the first electrode over the third transistor, the second electrode being electrically connected to a gate of the third transistor;

forming a second insulating film corresponding to the first insulating film over the second electrode;

forming a contact corresponding to first configuration data determined by using the first semiconductor device in the second insulating film; and forming a third wiring corresponding to the first wiring and a fourth wiring corresponding to the second wiring over the second electrode and the second insulating film to electrically connect the second electrode to one of the third wiring and the fourth wiring through the contact, wherein the second programmable logic element is configured to execute a same operation as the first programmable logic element programmed with the first configuration data.

8. The method for manufacturing the first semiconductor device according to claim 7, wherein the first wiring is configured to supply a first voltage, and wherein the second wiring is configured to supply a second voltage.

9. The method for manufacturing the first semiconductor device according to claim 7, wherein the first configuration data is determined by the steps of:

supplying a first gate signal to a gate of the second transistor to turn on the second transistor;

supplying a data signal corresponding to second configuration data to the first terminal of the second transistor;

storing a third charge corresponding to the second configuration data to the first capacitor;

storing a fourth charge corresponding to the second configuration data to the second capacitor, supplying a second gate signal to the gate of the second transistor to turn off the second transistor;

supplying a voltage corresponding to the second configuration data to the first programmable logic element from the first electrode;

performing an operation of the first programmable logic element determined by the second configuration data; and determining the second configuration data as the first configuration data when the first programmable logic element performs a desired operation.

* * * * *